United States Patent
Minato et al.

(10) Patent No.: US 9,853,194 B2
(45) Date of Patent: *Dec. 26, 2017

(54) LIGHT EMITTING APPARATUS AND METHOD FOR PRODUCING THE SAME

(71) Applicant: Nichia Corporation, Anan-shi (JP)

(72) Inventors: Shunsuke Minato, Anan (JP); Masahiko Sano, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/688,765

(22) Filed: Apr. 16, 2015

(65) Prior Publication Data

US 2015/0287896 A1 Oct. 8, 2015

Related U.S. Application Data

(63) Continuation of application No. 12/745,250, filed as application No. PCT/JP2008/071473 on Nov. 26, 2008, now Pat. No. 9,024,340.

(30) Foreign Application Priority Data

Nov. 29, 2007 (JP) .................................. 2007-308688

(51) Int. Cl.
*H01L 33/60* (2010.01)
*H01L 33/50* (2010.01)
(Continued)

(52) U.S. Cl.
CPC ............ *H01L 33/60* (2013.01); *H01L 33/505* (2013.01); *H01L 33/507* (2013.01); *H01L 33/56* (2013.01);
(Continued)

(58) Field of Classification Search
CPC ... H01L 33/56; H01L 25/0753; H01L 33/507; H01L 33/58; H01L 33/60; H01L 33/62;
(Continued)

(56) References Cited

U.S. PATENT DOCUMENTS 7,419,839 B2  9/2008 Camras et al.
2003/0025449 A1  2/2003 Rossner
(Continued)

FOREIGN PATENT DOCUMENTS

JP  2002-050800 A  2/2002
JP  2002-305328 A  10/2002
(Continued)

OTHER PUBLICATIONS

Extended European Search Report dated Jul. 30, 2014 as issued in corresponding EP 08853642.0 application.
(Continued)

*Primary Examiner* — Hrayr A Sayadian
(74) *Attorney, Agent, or Firm* — Foley & Lardner LLP

(57) ABSTRACT

A light emitting apparatus includes at least one light emitting device; a light transparent member that receives incident light emitted from the light emitting device; and a covering member. The light transparent member is a light conversion member that has an externally exposed light emission surface and a side surface contiguous to the light emission surface. The covering member contains a light reflective material, and covers at least the side surface of said light transparent member. A content of said light reflective material is not less than 30 wt %.

20 Claims, 8 Drawing Sheets

(51) Int. Cl.
*H01L 33/56* (2010.01)
*H01L 33/58* (2010.01)
*H01L 33/62* (2010.01)
H01L 33/44 (2010.01)
H01L 33/54 (2010.01)
H01L 25/075 (2006.01)

(52) U.S. Cl.
CPC ............. *H01L 33/58* (2013.01); *H01L 33/62* (2013.01); H01L 25/0753 (2013.01); H01L 33/44 (2013.01); H01L 33/54 (2013.01); H01L 2224/05001 (2013.01); H01L 2224/05023 (2013.01); H01L 2224/0568 (2013.01); H01L 2224/05568 (2013.01); H01L 2224/05644 (2013.01); H01L 2224/05655 (2013.01); H01L 2224/05664 (2013.01); H01L 2224/05666 (2013.01); H01L 2224/05669 (2013.01); H01L 2224/05671 (2013.01); H01L 2224/05673 (2013.01); H01L 2224/05684 (2013.01); H01L 2224/14 (2013.01); H01L 2224/16225 (2013.01); H01L 2224/73253 (2013.01); H01L 2933/0091 (2013.01)

(58) Field of Classification Search
CPC ................... H01L 33/505; H01L 33/44; H01L 2224/73253; H01L 33/54; H01L 2933/0091; H01L 2224/16225; H01L 2224/14; H01L 2224/05568; H01L 2224/05023; H01L 2224/05001; H01L 2224/05644; H01L 2224/05655; H01L 2224/05664; H01L 2224/05666; H01L 2224/05669; H01L 2224/05671; H01L 2224/05684; H01L 2924/00014
USPC .............................. 257/E33.072, E33.057, 98
See application file for complete search history.

(56) References Cited

U.S. PATENT DOCUMENTS

| | | | |
|---|---|---|---|
| 2003/0153108 A1 | 8/2003 | Durocher et al. | |
| 2003/0227249 A1* | 12/2003 | Mueller | H01L 33/501 313/491 |
| 2005/0077839 A1* | 4/2005 | Ho | H05B 33/0803 315/291 |
| 2005/0139851 A1* | 6/2005 | Sato | H01L 33/507 257/99 |
| 2006/0124951 A1 | 6/2006 | Sakata et al. | |
| 2007/0013057 A1* | 1/2007 | Mazzochette | H01L 25/0753 257/723 |
| 2009/0045422 A1 | 2/2009 | Kato et al. | |

FOREIGN PATENT DOCUMENTS

| | | |
|---|---|---|
| JP | 2005-057239 A | 3/2005 |
| JP | 2006-352061 A | 12/2006 |
| JP | 2007-019096 A | 1/2007 |
| RU | 2187175 C1 | 8/2002 |
| WO | WO-2004/065324 A1 | 8/2004 |
| WO | WO-2006/087651 A2 | 8/2006 |
| WO | WO-2006/111907 A2 | 10/2006 |
| WO | WO-2007/034919 A1 | 3/2007 |
| WO | WO-2008/056292 A1 | 5/2008 |

OTHER PUBLICATIONS

International Preliminary Report on Patentability (Form PCT/IB/373) dated Jun. 8, 2010 as received in corresponding PCT Application No. PCT/JP2008/071473.
International Search Report dated Dec. 22, 2008 as received in corresponding PCT Application No. PCT/JP2008/071473.
Non-Final Office Action on U.S. Appl. No. 12/745,250 dated Mar. 19, 2013, 9 pages.
Notice of Allowance on U.S. Appl. No. 12/745,250 dated Jan. 7, 2015, 7 pages.
Notification of Transmittal of Translation of the International Preliminary Report on Patentability (Form PCT/IB/338) dated Jun. 17, 2010 as received in corresponding PCT Application No. PCT/JP2008/071473.
Requirement for Restriction/Election on U.S. Appl. No. 12/745,250 dated Dec. 18, 2012, 13 pages.
Written Opinion of the International Searching Authority (Form PCT/ISA/237) dated Jun. 17, 2010 as received in corresponding PCT Application No. PCT/JP2008/071473.
Russian Office Action for Application No. 2010126475, dated Aug. 23, 2012, 7 pages.

* cited by examiner

LIGHT EMITTING APPARATUS AND METHOD FOR PRODUCING THE SAME

CROSS-REFERENCE TO RELATED APPLICATIONS

The present application is a Continuation of U.S. application Ser. No. 12/745,250, filed on May 27, 2010, which is a PCT National Phase Entry of PCT/JP2008/071473, filed Nov. 26, 2008, which claims Paris Convention priority to JP2007-308688, filed on Nov. 29, 2007 and hereby incorporated herein by reference in its entirety.

BACKGROUND

Technical Field

The present invention relates to a light emitting apparatus that includes a light transparent member that allows light from a light emitting device to pass through the light transparent member, and a method for producing the light emitting apparatus.

Background Art

Semiconductor light emitting devices are small and highly effective in power consumption, and emit vivid color light. In light emitting devices composed of a semiconductor element, there are no concerns about bulb burnout and the like. In addition, semiconductor light emitting devices have features such as excellent initial drive characteristics, and resistance to vibration or light ON/OFF repeats. Also, light emitting apparatuses have been developed that include a light emitting device and a wavelength conversion member and can emit light of various colors. In such light emitting apparatuses, the light emitting device emits source light, while the wavelength conversion member can be excited by the source light to emit light of color different from the source light. Combination of the source light and the light of converted color provides light emission of various colors based on additive color mixture principle. Since semiconductor light emitting devices have these excellent features, light emitting devices such as light emitting diodes (LEDs) and laser diodes (LDs) have been used as various types of light sources. Particularly, in recent years, attentions are given to semiconductor light emitting devices as replacement lighting sources for fluorescent light, and next-generation lighting with lower power consumption and longer life than fluorescent light. Accordingly, semiconductor light emitting devices are required to further improve light emission output and light emission efficiency. In addition, it is desired to provide a semiconductor light emitting device that serves as a high-luminance light source such as a car headlight and a floodlight.

One example of such semiconductor light emitting devices can be given by Patent Document 1 that discloses a light emitting apparatus 100. FIG. 10 shows a cross-sectional view of the light emitting apparatus 100. The light emitting apparatus 100 includes an LED device 102, and a case 103 that is provided with the LED device 102. The case 103 has an opening on a light outgoing side. The LED device 102 is mounted in this opening. Also, the opening of the case 103 is filled with a coating material 111 containing light reflective particles 111A. The coating material 111 covers the external area of the LED device 102 except a light outgoing surface 105A.

In addition, a sheet-shaped phosphor layer 110 is arranged on the external surface of the filling coating material 111, and on the light outgoing surface 105A. The phosphor layer 110 is composed of resin containing a phosphor such as YAG (Yttrium Aluminum Garnet), which can absorb light emitted from the LED device 2 (blue light) and be excited by the absorbed light to emit wavelength conversion light (yellow light). The phosphor layer 110 is arranged to cover the entire light outgoing surface 105A of the LED device 102, and has a light emission surface 110A exposed on the light outgoing side. The primary light from the LED device 102 (blue light) is mixed with the secondary light (yellow light) that is converted in wavelength from a part of the primary light. As a result, white light is obtained from the light emission surface 110A.

Patent Document 1: Japanese Patent Laid-Open Publication No. 2007-19096

Patent Document 2: Japanese Patent Laid-Open Publication No. 2002-305328

Problems to be Solved by the Invention

However, in the case of the light emitting apparatus 100 shown in FIG. 10, light enters the phosphor layer 110, and then outgoes from not only the light emission surface 110A (see an arrow L1 in FIG. 10) but also from a side surface 104 (see an arrow L2 in FIG. 10) that extends in the thickness direction. As a result, outgoing light L1 from the light emission surface 110A side exhibits white, while the outgoing light L2 from the side surface 104 side contains an insufficient blue component of primary light and thus exhibits yellowish white light. In other words, the mixture color rate of the primary light and the secondary light varies depending on parts of the phosphor layer 110. For this reason, there is a problem of color unevenness.

Also, in the case where a plurality of light emitting apparatuses 100 are combined for equipment such as lighting so that each light emitting apparatus 100 serves as a unit light source, light components from the unit light emitting apparatus may be focused or diffused by a light control system such as a lens that serves as a means for correcting the direction of the entire outgoing light to a desired outgoing direction. In this case, it is difficult to control the outgoing direction of a transverse light component of each unit light source, and in addition there is a color difference between the transverse light component and a frontward light component. Accordingly, the transverse light component is interrupted since the transverse light component is likely to deteriorate the entire light emission property of the light emitting apparatuses. This causes loss of luminous flux corresponding to the transverse light component, and luminance reduction. In other words, in the case of the light emitting apparatus 100, since there is color unevenness depending on parts of the phosphor layer 110 as light emission areas, if the light emitting apparatus 100 is used as a subordinate apparatus, it is necessary to interrupt inadequate light component. Consequently, its luminous flux and luminance may relatively decrease. Also, even if one light emitting apparatus is used, there is a problem similar to the above problem.

As stated above, as for light that passes through the phosphor layer 110 and outgoes from the light emitting apparatus, this light is composed of mixed color light of the primary light from the LED device 102, and the secondary light that is converted in wavelength in the phosphor layer 110. Desired color light is obtained in accordance with the mixture ratio of the primary light and the secondary light. In other words, the wavelength of emitted light depends on the amount of the wavelength conversion members, or the filling density of the wavelength conversion member in the phosphor layer 110. Practically, if the phosphor layer 110 contains an enough amount of wavelength conversion member to convert the wavelength of the outgoing light from the light source, the thickness of the phosphor layer 110 cannot be negligible. Although the thickness of the phosphor layer depends on the particle size of the wavelength conversion member itself, and the filling density of the wavelength conversion member, the thickness of the phosphor layer will be four or more times that of a semiconductor structure except its growth substrate by conservative estimates and will be twenty or more times in a normal sense. That is, light emission from the side surface in the light emitting apparatus is visually sufficiently perceivable. Accordingly, proportional to the thickness of the phosphor layer, the color unevenness problem becomes more noticeable. In addition to this, thermal stress of the wavelength conversion member may increase in accordance with increase of power applied to the LED when the LED is driven at a large amount of current. Heat generated by the wavelength conversion member and heat stress caused by the generated heat are likely to reduce light emission properties. In particular, in the case where, in order to realize a high-luminance light source, the wavelength conversion member and the light emitting device are arranged close to or joined to each other, the amount of heat generated by the wavelength conversion member will increase. In this case, a reliability problem caused by said heat may be noticeable. Also, if a plurality of light emitting devices are integrated to provide high luminance, this integration will further complicate the problems that arise in the aforementioned single light emitting device. For example, luminance unevenness and color unevenness caused by the arrangement of the light emitting devices arise in the light emission surface. In addition, since the light emission surface is increased, the luminance unevenness and color unevenness are likely to be affected by the density and the uneven distribution of the aforementioned wavelength conversion member, and as a result the color unevenness will be likely to arise. In addition, since the number of the light emitting devices increases, heat generation will increase, and cooling paths will be complicated so that heat distribution deteriorates.

SUMMARY

The present invention is devised to solve the above conventional problems. It is an object of the present invention to provide a light emitting apparatus that is excellently resistant to high temperature and can emit light with less color unevenness at high-luminance or can emit light at high power, and a method for producing the light emitting apparatus.

Means for Solving Problem

To achieve the aforementioned object, a light emitting apparatus according to a first aspect of the present invention includes a light emitting device, a light transparent member that receives incident light emitted from the light emitting device, and a covering member. The light transparent member is formed of an inorganic material light conversion member that has an externally exposed light emission surface and a side surface contiguous to the light emission surface. The covering member contains a light reflective material, and covers at least the side surface of the light transparent member.

Also, in a light emitting apparatus according to a second aspect of the present invention, the covering member surrounds the light emitting device.

Also, in a light emitting apparatus according to a third aspect of the present invention, the light transparent member is plate-shaped, and has a light receiving surface opposed to the light emission surface. The light emitting device is joined to the light receiving surface.

Also, in a light emitting apparatus according to a fourth aspect of the present invention, the light emitting device is mounted on a mount substrate in a flip-chip mounting manner.

Also, in a light emitting apparatus according to a fifth aspect of the present invention, the covering member covers the light emitting device.

Also, in a light emitting apparatus according to a sixth aspect of the present invention, the light emitting device is enclosed by the light transparent member in plan view from the light emission surface side.

Also, in a light emitting apparatus according to a seventh aspect of the present invention, a plurality of light emitting devices are optically connected to one light transparent member.

Also, a light emitting apparatus according to an eighth aspect of the present invention includes a plurality of light emitting device, a covering member that surrounds the light emitting device, and a light transparent member. The light transparent member is a plate-shaped light conversion member that is made of an inorganic material, and has an externally exposed light emission surface, a side surface contiguous to the light emission surface and a light receiving surface opposed to the light emission surface. The plurality of light emitting devices are joined to the light receiving surface of the light transparent member, and light from each of the light emitting devices is incident upon the light receiving surface. In addition, the covering member contains a light reflective material, and covers at least the side surface of the light transparent member.

Also, in a light emitting apparatus according to a ninth aspect of the present invention, each of the light emitting devices is mounted on a mount substrate in a flip-chip mounting manner.

Also, in a light emitting apparatus according to a tenth aspect of the present invention, the covering member covers each of the light emitting devices.

Also, in a light emitting apparatus according to an eleventh aspect of the present invention, each of the light emitting devices is separated away from the covering member by a hollow part.

Also, in a light emitting apparatus according to a twelfth aspect of the present invention, the covering member includes, on the light emission surface side of the light emitting apparatus, an externally exposed surface substantially coplanar with the light emission surface.

Also, in a light emitting apparatus according to a thirteenth aspect of the present invention, the light emitting device is enclosed by the light transparent member in plan view from the light emission surface side.

Also, in a light emitting apparatus according to a fourteenth aspect of the present invention, junction areas and a covering area are arranged on the light receiving surface side of the light transparent member. The light emitting devices are joined to the junction areas, and the covering area is covered by the covering member.

Also, in a light emitting apparatus according to a fifteenth aspect of the present invention, the light emitting devices are separated away from each other, and a separation area is arranged on the light receiving surface side of the light transparent member between the junction areas. The covering area is arranged in the separation area.

Also, in a light emitting apparatus according to a sixteenth aspect of the present invention, the light transparent member includes a protrusion area that protrudes outward relative to the light emitting devices. The covering area is located in the protrusion area of the light receiving surface.

Also, in a light emitting apparatus according to a seventeenth aspect of the present invention, the covering member contains, in a transparent resin, at least one oxide containing an element selected from the group consisting of Ti, Zr, Nb and Al as the light reflective material.

Also, in a light emitting apparatus according to an eighteenth aspect of the present invention, the covering member is a porous material composed of at least one material selected from the group consisting of $Al_2O_3$, AlN, MgF, $TiO_2$, $ZrO_2$, $Nb_2O_5$, $SiO_2$ as the light reflective materials.

Also, in a light emitting apparatus according to a nineteenth aspect of the present invention, the light conversion member contains a phosphor, and can convert the wavelength of at least a part of light emitted from the light emitting device.

Also, in a light emitting apparatus according to a twentieth aspect of the present invention, the light conversion member is a sintered material of an inorganic substance and the phosphor.

Also, in a light emitting apparatus according to a twenty-first aspect of the present invention, the inorganic substance is alumina ($Al_2O_3$), and the phosphor is YAG ($Y_3Al_5O_{12}$).

Also, a light emitting device production method according to a twenty-second aspect of the present invention is a method for producing a light emitting apparatus including a light emitting device, a light transparent member that receives incident light emitted from the light emitting device, and a covering member. The method includes first to third steps. In the first step, the light emitting device is mounted on a wiring substrate so that the light emitting device and the wiring substrate are electrically connected to each other. In the second step, at least a part of a light outgoing side opposed to the mount side of the light emitting device is optically connected to the light transparent member. In the third step, a side surface of the light transparent member extending in the thickness direction is covered by the covering member. The covering member is formed so that the external surface of the covering member extends along the external surface the external surface of said light transparent member.

Effects of the Invention

In the configuration of a light emitting apparatus according to the present invention, as for a light transparent member, a light emission surface from which light outgoes is exposed from a covering member, and a side surface contiguous to the light emission surface is covered by the covering member. That is, substantially only the light emission surface serves as the light emission area of the light emitting apparatus. Since the side surface is covered by the covering member, light that travels from the light emitting device to the side surface side is reflected by the covering member adjacent to the side surface so that this reflected component of light can outgoes from the light emission surface side. As a result, it is possible to avoid that light with different color from the central part of the light transparent member passes the side surface and outgoes. Consequently, it is possible to suppress that color unevenness appears. In addition, since light traveling toward the side surface can be directed to outgo from the light emission surface side, it is possible to suppress the loss of the entire luminous flux amount and to improve the luminance on the light emission surface. Accordingly, it is possible to provide emitted light having excellent directivity and luminance. As a result, emitted light can be easily optically controlled. Therefore, in the case where each light emitting apparatus is used as a unit light source, the light emitting apparatus has high secondary usability. In addition, since heat can be conducted to the covering member, it is possible to improve heat dissipation from the light transparent member. Therefore, it is possible to improve the reliability of the light emitting apparatus. Furthermore, in the case of a light emitting apparatus that includes a plurality of integrated light emitting devices, it is possible to provide uniform luminance distribution in the plane of the light emitting apparatus. Therefore, it is possible to provide a high luminance light source with reduced color unevenness.

Also, according to a light emitting apparatus production method of the present invention, since after a light transparent member is positioned, a side surface of the light transparent member is covered by a covering member, it is possible to provide desired adjustment for a light emission surface of the light transparent member. In addition, it is possible to easily airtightly seal a light emitting device surrounded by the light transparent member and the covering member.

DETAILED DESCRIPTION OF THE PREFERRED EMBODIMENTS

Figure 1:
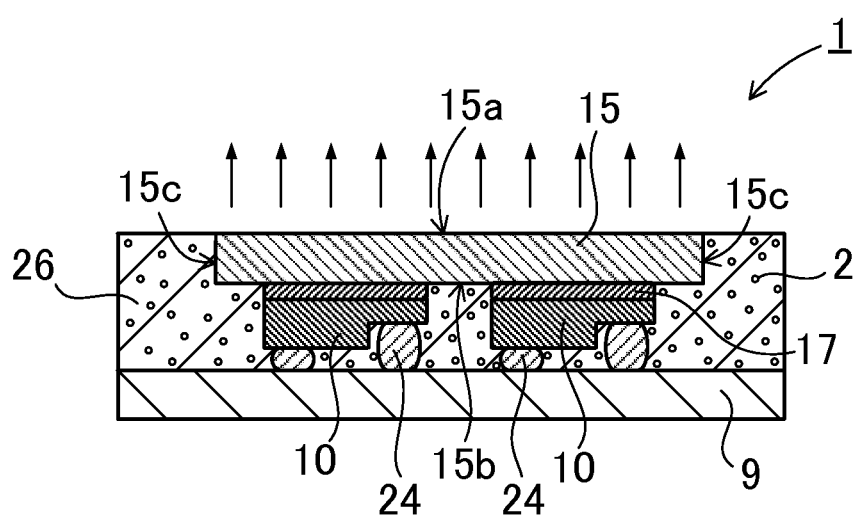
FIG. 1 Cross-sectional view schematically showing a light emitting apparatus according to an embodiment 1.

The following description will describe embodiments according to the present invention with reference to the drawings. It should be appreciated, however, that the embodiments described below are illustrations of a light emitting apparatus and a production method of the light emitting apparatus to give a concrete form to technical ideas of the invention, and a light emitting apparatus and a production method of the light emitting apparatus of the invention is not specifically limited to description below. In this specification, reference numerals corresponding to components illustrated in the embodiments are added in "Claims" and "Means for Solving Problem" to aid understanding of claims. However, it should be appreciated that the members shown in claims attached hereto are not specifically limited to members in the embodiments. Unless otherwise specified, any dimensions, materials, shapes of the components and relative arrangements of the components described in the embodiments are given as examples and not as limitations.

Additionally, the sizes and the arrangement relationships of the members in each of drawings are occasionally shown larger exaggeratingly for ease of explanation. Members same as or similar to those of this invention are attached with the same designation and the same reference numerals, and their description is omitted. In addition, a plurality of structural elements of the present invention may be configured as a single part that serves the purpose of a plurality of elements, on the other hand, a single structural element may be configured as a plurality of parts that serve the purpose of a single element. Also, descriptions of some examples or embodiments may be applied to another example, embodiment or the like. Also, in this specification, the term on (e.g., on a layer) is not limited to the state where a layer is formed in contact with an upper surface of another layer but includes the state where a layer is formed above an upper surface of another layer to be spaced away from the upper surface of another layer, and the state where a layer is formed to interposes an interposition layer between the layer and another layer. In addition, in this specification, a covering member is occasionally referred to as a sealing member.

Embodiment 1

FIG. 1 is a cross-sectional view schematically showing a light emitting apparatus 1 according to an embodiment 1 of the present invention. The light emitting apparatus 1 according to the example shown in FIG. 1 is principally configured as follows. The light emitting apparatus principally includes light emitting device 10, a light transparent member 15 that allows light emitted from the light emitting device 10 to pass through, and a covering member 26 that partially covers the light transparent member 15. The light emitting device 10 are mounted on a wiring substrate 9 by electrically conductive members 24. The light transparent member 15 is located on the upper side of the light emitting device 10, and optically connected to the light emitting device 10. The light transparent member 15 has a light receiving surface 15b that receives light from the light emitting device 10, and a light emission surface 15a that serves as a plane for emitting the received light and composing the external surface of the light emitting apparatus 1. In addition, the light transparent member 15 has side surfaces 15c that extend substantially perpendicular to the light emission surface 15a and in parallel to the thickness direction.

Also, parts of the light transparent member 15 are covered by the covering member 26. The light emission surface 15a is exposed from the covering member 26 to emit light outward. The covering member 26 contains a light reflective material 2 capable of reflecting light. In addition, the covering member 26 covers at least the side surfaces 15c contiguous to the light emission surface 15a of the light transparent member 15. The covering member 26 is preferably formed so that the exposed surface of the covering area of the covering member 26 is substantially coplanar with the plane of the light emission surface 15a. According to the aforementioned configuration, light emitted from the light emitting device 10 travels to the light transparent member 15. The light emission surface 15a serves as a window portion of the light emitting apparatus. Thus, the light outgoes from this window portion. The window portion is arranged on the forward surface side in the outgoing direction relative to the covering member that surrounds the light transparent member. In other words, the covering member is substantially coplanar with the light emission surface, or is retracted from the light emission surface toward the light receiving surface so that the covering member does not interrupt light from the light emission surface of the light transparent member.

Also, the light transparent member 15 includes a wavelength conversion member that can convert the wavelength of at least a part of light emitted from the light emitting device 10. That is, outgoing light from the light emitting device 10 is added to and mixed with the secondary light that is produced by converting the wavelength of a part of the outgoing light. As a result, the light emitting apparatus can emit light with desired wavelength. Member and structures of the light emitting apparatus 1 according to the present invention will be described below.

(Light Emitting Device)

Known light emitting devices, specifically semiconductor light emitting devices can be used as the light emitting device 10. GaN group semiconductors are preferably used since they can emit short wavelength light that efficiently excites fluorescent materials. Positive and negative electrodes of the light emitting device 10 according to the embodiment 1 are formed on the same surface side. However, the positive and negative electrodes are not limited to this arrangement. For example, the positive and negative electrodes may be formed on respective surfaces. In addition, the positive and negative electrodes are not necessarily limited to one pair. A plurality of positive or negative electrodes may be formed.

In terms of a short wavelength range of the visible light range, a near ultraviolet range or a shorter wavelength than the near ultraviolet range, a later-discussed nitride semiconductor in the following embodiments is preferably used as a semiconductor layer 11 in a light emitting apparatus that combines the nitride semiconductor and the wavelength conversion member (phosphor). Also, the semiconductor layer is not limited to this. The semiconductor layer can be semiconductors such as ZnSe group, InGaAs group, and AlInGaP group semiconductor.

(Light Emitting Device Structure)

The light emitting device structure formed by the semiconductor layer preferably includes an active layer between a first conductive type (n-type) layer and a second conductive type (p-type) layer discussed later in terms of its output and efficiency. However, the structure is not limited to this. Each conductive layer may partially includes an insulating, semi-insulating, or opposite conductive type structure. Also, such a structure may be additionally provided to the first or second conductive type layer. Another type structure such as protection device structure may be additionally provided to the first or second conductive type layer. Also, the aforementioned substrate may serve as a part of conduction type layer of the light emitting device. In the case where the substrate does not compose the light emitting device structure, the substrate may be removed. Also, the growth substrate may be removed after the semiconductor layers are formed, and the separated semiconductor device structure, i.e., the separated semiconductor layers may be adhered onto or mounted in a flip chip mounting manner on a support substrate such as a conductive substrate. Also, another transparent member and another transparent substrate may be adhered onto the semiconductor layers. Specifically, in the case where the growth substrate, or the adhered member or substrate is located on the light outgoing side of semiconductor layers as a main surface, the growth substrate, or the adhered member or substrate has transparency. In the case where the growth substrate does not have transparency, or blocks or absorbs light, and the semiconductor layers are adhered onto such a substrate, the substrate is located on the light reflection side of the semiconductor layer main surface. In the case were charge is provided to the semiconductor layers from a transparent substrate or member on the light outgoing side, the transparent substrate or member will have conductivity. Also, the light transparent member 15 may be used instead of the transparent member or substrate connected to the semiconductor layers. In addition, in the device, the semiconductor layers may be adhered or covered, and supported by a transparent member such as glass and resin. The growth substrate can be removed by grinding the growth substrate held on a chip mounting portion of a sub-mount or apparatus, or LLO (Laser Lift Off) for the held growth substrate, for example. Even in the case of a transparent different type substrate, it is preferable to remove the substrate. The reason is that light outgoing efficiency and output can be improved.

Examples of the structure of the light emitting device or semiconductor layers 11 can be given by homo structure, hetero structure or double-hetero structures with MIS junction, PIN junction or PN junction. A superlattice structure can be applied to any layer. The active layer 8 can have a single or multi-quantum well structure provided with thin layer(s) for quantum effect.

As for the electrodes arranged on the semiconductor layer, it is preferable that first conductive type (n-type) and second conductive type (p-type) layer electrodes are located on one surface as main surface as discussed later and in examples. However, the electrodes are not limited to this arrangement. The electrodes may be located on the main surfaces of semiconductor layers and be opposed to each other. For example, in the case of the aforementioned substrate-removed structure, one of the electrodes can be arranged on the removal side. The light emitting device can be mounted in known manners. For example, in the case where the device structure has the positive/negative electrodes on the same surface side, the light emitting device can be mounted so that the electrode formation surface serves as the main light outgoing surface. In terms of heat dissipation, the flip tip mounting is preferable in that the growth substrate side opposed to the electrode formation side serves as the main light outgoing surface as discussed later and in examples. In addition to this, mounting methods suitable for device structures can be used.

Figure 2:
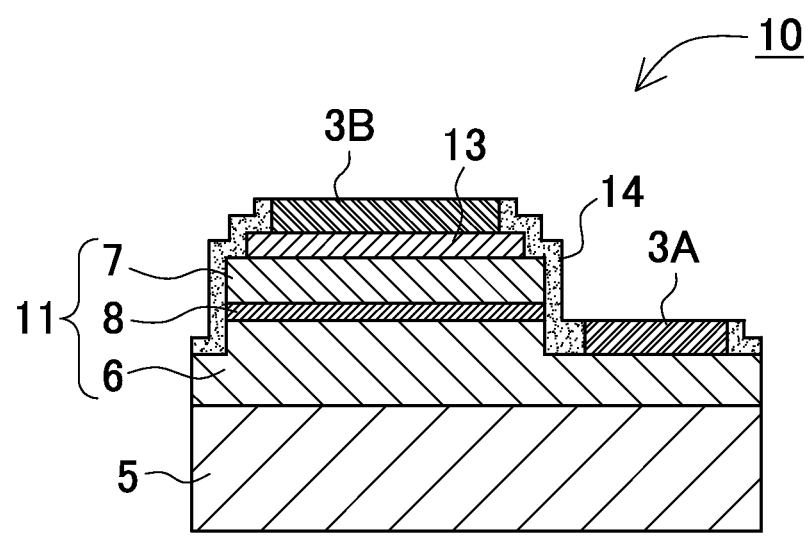
FIG. 2 Cross-sectional view schematically showing a light emitting device according to the embodiment 1.

The light emitting devices 10 installed on the light emitting apparatus 1 shown FIG. 1 are LED chips, which are nitride semiconductor devices. LED chips are mounted on the sub-mount as one of wiring substrate 9 in a flip chip mounting manner. FIG. 2 is a cross-sectional view schematically showing the light emitting device 10. The light emitting device 10 shown in FIG. 2 is an exemplary light emitting device.

The structure of the light emitting device 10 is described with reference to FIG. 2. The light emitting device 10 includes nitride semiconductor layers as the semiconductor structure 11 that are laminated on the growth substrate 5 as one main surface side of a pair of main surfaces opposed to each other. In the semiconductor structure 11, a first nitride semiconductor layer 6, the active layer 8, and a second nitride semiconductor layer 7 are laminated in this order from the bottom side. Also, the first electrode 3A and the second electrode 3B are electrically connected to the first nitride semiconductor layer 6 and the second nitride semiconductor layer 7, respectively. When electric power is supplied from an outside source via the first electrode 3A and the second electrode 3B, the light emitting device 10 emits light from the active layer 8. The following description will describe a production method of a nitride semiconductor light emitting device as an example of the light emitting device 10.

(Light Reflection Structure)

The light emitting device 10 can have a light reflection structure. Specifically, the light reflection side can be one main surface (lower side in FIG. 1) opposed to the light outgoing side of the two main surfaces of the semiconductor layers opposed to each other. The light reflection structure can be arranged on this light reflection side, and in particular can be arranged inside of the semiconductor layer structure, on the electrode, or the like.

(Transparent Conductive Layer)

As shown in FIG. 2, a transparent conductive layer 13 is formed on the p-type semiconductor layer 7. In addition, a conductive layer can also be formed substantially entirely on an exposed surface of the n-type semiconductor layer 6. Alternatively, in the case where a reflection structure is arranged on the transparent conductive layer 13, the electrode formation surface side can serves as the reflection side. Alternatively, in the case where a transparent conductive layer is exposed from a pad electrode, light can outgoes from this transparent conductive layer. Alternatively, a reflective electrode may be arranged on the semiconductor layer structure without such a transparent conductive layer. The transparent conductive layer 13 is not limited to cover each of the n-type semiconductor layer 6 and the p-type semiconductor layer 7, but can cover only one of the semiconductor layers. The transparent conductive layer 13 is preferably composed of oxide that contains at least one element selected from the group consisting of Zn, In, and Sn. Specifically, the transparent conductive layer 13 is used that includes oxide of Zn, In and SD such as ITO, ZnO, $In_2O_3$ and $SnO_2$. Preferably, ITO is used. Alternatively, the transparent conductive layer may have a light transparent structure, for example, a metal film that is configured by forming metal as Ni into a thin film with thickness of 3 nm, a metal film of oxide of other metal, nitride or other compound with openings as window portions. In the case where the conductive layer is formed substantially entirely on the exposed p-type semiconductor layer 7, current can spread uniformly on the entire p-type semiconductor layer 7. In addition, the thickness and the size of the transparent conductive layer 13 can be designed in terms of the light absorption and electrical resistance/sheet resistance i.e., the transparency and reflection structure and current spreading of the layer. For example, the thickness of the transparent conductive layer 13 can be not more than 1 μm, more specifically 10 nm to 500 nm.

(Electrode)

The electrode layer is formed on the semiconductor layer structure. In the case where the aforementioned transparent conductive layer is interposed between the electrode layer and the semiconductor layer structure, the electrode layer is electrically connected to the transparent conductive layer. The electrodes are formed in contact with the transparent conductive layers 13 suitably arranged on the p-type semiconductor layer 7 and then-hype semiconductor layer 6 side, or on the semiconductor structure so that the first electrode 3A and the second electrode 3B are configured. The electrode layers can be electrically connected to the light emitting device 10 and the external terminals to serve as pad electrodes. For example, the electrically conductive members 24 such as Au bumps are arranged on the surfaces of the metal electrode layers so that the electrodes of the light emitting device are electrically connected to the external terminals opposed to these electrodes via the electrically conductive members. Also, in the case of FIG. 2, the metal electrode layer 3B overlaps the transparent conductive layer 13, and is electrically directly connected to the transparent conductive layer 13. The pad electrode suitably has a known configuration. For example, the electrode is formed of any one metal of Au, Pt, Pd, Rh, Ni, W, Mo, Cr and Ti, or an alloy or a combination of them. An exemplary metal electrode layer can have a lamination structure of W/Pt/Au, Rh/Pt/Au, W/Pt/Au/Ni, Pt/Au or Ti/Rh in this order from the bottom surface side.

As for the electrode layers formed on the p-type nitride semiconductor layer 7 and the n-type nitride semiconductor layer 6 side of the aforementioned nitride semiconductor light emitting device or the respective conduction type electrodes, the electrodes layers or the respective conduction type electrodes preferably have the same configuration in types, layer thicknesses and layer structures of metals. The reason is that formation of the electrodes layers or the respective conduction type electrodes together can simplify a formation process of electrodes including the aforementioned transparent conductive layers as compared with separate formation. In the case of separate formation, the electrode on the n-type nitride semiconductor layer side can be a W/Pt/Au electrode (for example, the layer thicknesses are 20/200/500 nm) or an additionally-Ni-laminated electrode of W/Pt/Au/Ni, a Ti/Rh/Pt/Au electrode or the like.

(Protection Film)

After the metal electrode layer is formed, an insulating protection film 14 can be formed substantially on the entire surface of the semiconductor light emitting device 10 except for connection areas to the external areas. In the case of FIG. 2, openings are formed in the protection film 14 that covers the n-type electrode 3A part and the p-type electrode 3B part to form exposed areas for the electrodes. The protection film 14 can be formed of $SiO_2$, $TiO_2$, $Al_2O_3$, polyimide or the like.

Also, as for the light emitting devices installed on the light emitting apparatus, although the light emission peak wavelength of outgoing light emitted from the light emitting layer is not specifically limited, semiconductor light emitting devices can be used that have an emission spectrum of about 240 nm to 500 nm, which corresponds to the near ultraviolet range to the visible short wavelength range, preferably of 380 nm to 420 nm or of 450 nm to 470 nm.

(Nitride Semiconductor Light Emitting Device)

The following description will describe a nitride semiconductor light emitting device as an example of the light emitting device 10 and a production method of the nitride semiconductor light emitting device.

In the light emitting device 10 of nitride semiconductor of FIG. 2, the n-type semiconductor layer as the first nitride semiconductor layer 6, the light emitting layer as the active layer 8, and the p-type semiconductor layer as the second nitride semiconductor layer 7 are epitaxially grown on the sapphire substrate as the growth substrate 5 in this order so that the nitride semiconductor layer structure 11 is formed. Subsequently, the light emitting layer 8 and the p-type semiconductor layer 7 are selectively partially etched and removed so that the n-type semiconductor layer 6 is partially exposed. The n-type pad electrode as the first electrode 3A is formed on the exposed area. The p-type pad electrode as the second electrode 3B is formed on the transparent conductive layer 13 on the same plane side as the n-type electrode 3A. In addition, only predetermined surface parts of the n-type pad electrode 3A and the p-type pad electrode 3B are exposed, and other parts can be covered by the insulating protection film 14. The n-type pad electrode 3A may be formed on the exposed area of the n-type semiconductor layer 6 to interpose the transparent conductive layer between them. When electric power is supplied from an outside source via the first electrode 3A and the second electrode 3B, the light emitting device 10 emits light from the active layer 8. Light mainly outgoes from the upper surface side as shown by arrows in FIG. 1. That is, in the light emitting device 10 shown in FIG. 1, the electrode formation surface side is the mount side (lower side in FIG. 1), while other main surface side (upper side in FIG. 1) opposed to the electrode formation surface side is the main light outgoing side. The following description will specifically describe constituent elements of the semiconductor light emitting device 1.

(Growth Substrate)

The semiconductor layer structure 11 epitaxially grows on the growth substrate 5. The growth substrate 5 for nitride semiconductor can be sapphire with C facet, R facet or A facet as principal surface, an insulating substrate such as spinal ($MgAl_2O_4$), silicon carbide (6H, 4H, or 3C), Si, ZnS, ZnO, GaAs, diamond, an oxide substrate capable of joining with nitride semiconductor with lattice matching such as lithium niobate and neodymium gallate, or a nitride semiconductor substrate such as GaN and AlN.

(Nitride Semiconductor Layer)

The nitride semiconductor is formed of general formula $In_xAl_yGa_{1-x-y}N$ ($0 \le x$, $0 \le y$, $x+y \le 1$), and may be mixed with B, P, or As. The n-type semiconductor layer 6 and the p-type semiconductor layer 7 are not specifically limited to a single layer or a multilayer structure. The nitride semiconductor layer structure 11 includes a light emitting layer 8 as the active layer. The active layer has a single (SQW) or multi-quantum well structure (MQW). The following description will describe an example of the nitride semiconductor layer 11.

A lamination structure is formed on the growth substrate to interpose a primary layer of nitride semiconductor such as a buffer layer (e.g., a low-temperature growth thin film GaN and a GaN layer) between the lamination structure and the growth substrate. In the lamination structure, for example, an n-type contact layer of Si-doped GaN and an n-type multilayer structure of GaN/InGaN are laminated as the n-type nitride semiconductor layer. Subsequently, the active layer of InGaN/GaN MQW is laminated. In addition, for example, a p-type multilayer structure of Mg-doped InGaN/AlGaN and a p-type contact layer of Mg-doped GaN are laminated as the p-type nitride semiconductor layer. Also, the nitride semiconductor light emitting layer 8 (active layer) has a quantum well structure including a well layer, or barrier layers and well layers, for example. Although a nitride semiconductor used for the active layer may be doped with p-type impurities, it is preferable the nitride semiconductor is not doped or is doped with n-type impurities. The reason is that the non-doped or n-type doped nitride semiconductor can provide a high output light emitting device. In the case where the well layer contains Al, it is possible to obtain a wavelength shorter than the wavelength 365 nm of the band gap energy of GaN. The wavelength of light emitted from the active layer can be set to 360 to about 650 nm, preferably 380 to 560 nm in accordance with the purposes, applications and the like of light emitting devices. InGaN is suitably used for visible light and near-ultraviolet ranges as the composition of the well layer. In this case, GaN or InGaN is preferably used as the barrier layer. Exemplary film thicknesses of the barrier layer and the well layer are 1 nm to not more than 30 nm, and 1 nm to not more than 20 nm, respectively. One well layer can compose the single quantum well structure. A plurality of well layers interposed between the barrier layers and the like can compose the multi quantum well structure.

Subsequently, a mask forming a predetermined shape is formed on the surface of the p-type semiconductor layer 7, and the p-type semiconductor layer 7 and the active layer as the light emitting layer 8 are etched. As a result, the n-type contact layer composing the n-type semiconductor layer 6 is exposed in a predetermined location. As shown in FIG. 2, the n electrode 3A, the p electrode 13 and the pad electrode 3B as a reflection electrode are formed on the n-type and p-type contact layers. The protection film 14 is formed on the surface of the device so as to expose electrode coupling portions. Thus, the nitride semiconductor light emitting device is produced.

(Wiring Substrate)

In the light emitting apparatus 1 shown in FIG. 1, as the wiring substrate 9 to be provided with the aforementioned light emitting devices 10, a substrate can be used that has at least wires to be connected to the electrodes of the devices on the surface of the substrate. The material of the substrate can be a crystalline substrate such as a monocrystalline or polycrystalline substrate formed of aluminum nitride, or a sintered substrate, as well as ceramics such as alumina, glass, a semimetal (e.g. Si) or metal substrate, or a lamination or composite member composed of them such as a substrate with an aluminum nitride thin film formed on the surface of them. A metal substrate, a metallic substrate and a ceramic substrate are preferable, since they have high heat dissipation properties. In wiring pattern formation, a metal layer is patterned by ion milling or etching. An example of wiring pattern can be provided by a patterned platinum thin layer formed on the aforementioned aluminum nitride substrate. In addition, a protection film such as $SiO_2$ thin film or the like can be formed on the surface side of the substrate where the wiring pattern is formed. A substrate to be provided with the light emitting device is not limited to a wiring substrate to be connected to the electrodes of the light emitting device. A substrate without wiring pattern may be used. For example, in the case where the electrode formation surface side of the light emitting device serves as a main light emission side, the substrate side of the light emitting device may be mounted on the substrate without wiring pattern, and the electrodes of the device may be connected to terminals of the apparatus by wires. In the arrangement of the substrate and the covering member, the covering member can be arranged on the substrate as shown in the illustrated the light emitting apparatus. Additionally, the covering member may cover the side surfaces of the substrate.

(Transparent Member)

The light emitting apparatus 1 shown in FIG. 1 includes the light transparent member 15 that allows light from the light emitting device 10 to pass through the light transparent member 15. It is preferable that the light transparent member 15 is a light conversion member that can convert the wavelength of at least a part of the passing light, and contains the wavelength conversion member. Thus, when primary light from the light source passes through the light transparent member 15, the phosphor as the wavelength conversion member is excited whereby providing secondary light with a wavelength different from the wavelength of the main light source. As a result, the color of the secondary light is mixed with the color of the primary light that is not converted in wavelength. Therefore, it is possible to provide outgoing light with a desired color.

Figure 13:
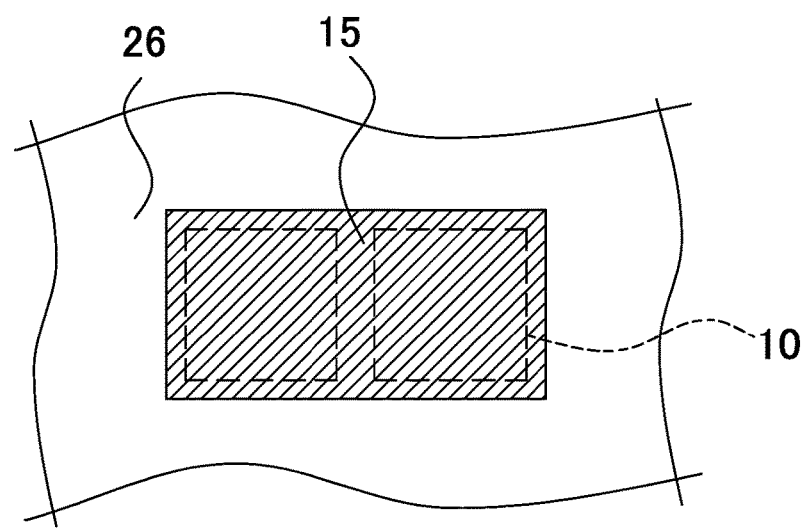
FIG. 13 Schematic plan view showing the periphery of the light transparent member of the light emitting apparatus according to the example 3 or the comparative example 2 before the thermal resistance test.

The light emitting device 10 is enclosed by the light transparent member 15 shown in FIG. 1 in plan view from the light emission surface 15a. In other words, as shown in FIG. 1, the side surfaces 15c of the light transparent member 15 protrude outward relative to end surfaces 33 as the side surfaces of the light emitting devices 10. Accordingly, as compared with the case of FIG. 5 (embodiment 3), outgoing light from the optically-connected light emitting device 10 can be directly received by the light receiving surface 15b wider than the upper surface of the light emitting device 10. Therefore, luminous flux loss is small. The protrusion amount of the side surface 15c of the light transparent member 15 relative to the side surface of the light emitting device 10 is not less than 3% to not more than 30% of the size of the light emitting device, and more specifically not less than 5% to not more than 15%. For example, in the light emitting apparatus according to the example 1, as shown in FIG. 13, the protrusion width of the transparent member 15 at the ends is about 50 µm.

As the aforementioned transparent member included in the light transparent member together with the wavelength conversion member, a similar material to the later-described covering member can be used. For example, resins, glass, and inorganic substances can be used. Also, a formed or crystalline member of the later-described wavelength conversion member may be used. In the case where the light transparent member has a plate shape, it is preferable that both the light emission surface and the light receiving surface are substantially flat and that the both opposed surfaces are parallel to each other so that light suitably travels from the light receiving surface to the light emission surface. However, the present invention is not limited to this shape. The light emission surface and the light receiving surface are not limited to a flat surface. The light emission surface and the light receiving surface can entirely or partially have a curved surface as well as a planar shape such as an uneven surface. The light emission surface and the light receiving surface are not limited to a planar shape, but can have various forms and shapes, for example, a shape for focusing or dispersing light such as an optical shape (e.g., lens shape).

As for the wavelength conversion function of the light transparent member, the light emitting apparatus can emit mixed color light by mixing light from the light emitting device and light converted from the light. In addition, the light emitting apparatus can emit secondary light converted from primary light from the light emitting device, for example, can emit light converted from ultraviolet light from the light emitting device or mixed color light by mixing a plurality of converted light colors.

Specifically, the light transparent member 15, which has the wavelength conversion function, can be composed of a glass plate with a light conversion member; a phosphor crystal of light conversion member, or a single crystal, polycrystal, amorphous substance or ceramic having the phase of the phosphor crystal; a sintered substance, aggregated substrate or porous material of phosphor crystal particles and transparent member suitably added to the phosphor crystal particles; a member with a transparent member (e.g., resin) mixed to or impregnated with them; or a transparent member containing phosphor particles (e.g., a transparent resin formed member, etc.). It is preferable that the light transparent member is composed of an inorganic material rather than organic materials such as resin in terms of thermal resistance. Specifically, the light transparent member is preferably composed of a transparent inorganic material that contains a phosphor. In particular, in the case where the light transparent member is composed of a sintered substance of a phosphor and an inorganic substance (binding material), or is formed from a sintered substance or single crystal of phosphor, the reliability is increased. In the case where the later-discussed YAG (yttrium aluminum garnet) phosphor is used, it is preferable that the light transparent member is a YAG/alumina sintered substance using alumina ($Al_2O_3$) as biding material (binder) as well as a YAG single crystal and a high purity YAG sintered substance in terms of reliability. Although the shape of the light transparent member 15 is not specifically limited, the light transparent member 15 is formed in a plate shape in the embodiment 1. In the case of the plated shaped light transparent member, the light transparent member has high coupling efficiency with the light outgoing surface of the light emitting device 10 formed in a plate shape, and additionally the light outgoing surface can be easily arranged substantially in parallel to the main surface of the light transparent member 15. In addition to this, in the case where the light transparent member 15 has a substantially constant thickness, uneven distribution of the constituent wavelength conversion member can be suppressed. As a result, it is possible to substantially uniform the wavelength conversion amount of the light that passes through the light transparent member 15, and to stabilize the mixed color ratio. Consequently, it is possible to suppress part-to-part color unevenness in the light emission surface 150. For this reason, in the case where a plurality of light emitting devices 10 are arranged under one light transparent member 15, it is possible to provide high luminance light emission with less unevenness caused by arrangement of the light emitting devices 10 in luminance and in color distribution in the light emission surface. It is preferable that the thickness of the light transparent member 15, which has the wavelength conversion function, is not less than 10 μm and not more than 500 μm, and more preferably not less than 50 μm and not more than 300 μm in terms of light emission efficiency and color adjustment.

A phosphor of YAG activated by cerium and a phosphor of LAG (lutetium aluminum garnet) can be given as examples of typical phosphors to be used for a wavelength conversion member that can be suitably combined with a blue light emitting device to emit white light. In particular, in the case of high luminance and long duration use, it is preferable that $(Re_{1-x}Sm_x)_3(Al_{1-y}Ga_y)_5O_{12}$:Ce (where, $0 \leq x \leq 1$, $0 \leq y \leq 1$, and Re is at least one element selected from the group consisting of Y, Gd, La and Lu) or the like is employed. Also, a phosphor can be employed that contains at least one selected from the group consisting of YAG, LAG, BAM, BAM:Mn, (Zn, Cd)Zn:Cu, CCA, SCA, SCESN, SESN, CESN, CASBN, and $CaAlSiN_3$:Eu.

The light emitting apparatus 1 may include a plurality of wavelength conversion members or a plurality of light transparent members that have the function of the wavelength conversion member. For example, the aforementioned light conversion member can include two or more types of mixed phosphors. In addition to this, the light emitting apparatus 1 can include a light transparent member that has a plurality of wavelength conversion members for converting a wavelength to other wavelengths different from each other or include a plurality of light transparent members have the function. For example, the light emitting apparatus 1 can include a laminated member of the light transparent members. Also, the light emitting apparatus 1 can include a light transparent member that includes one type of wavelength conversion member or have the function of the one type of wavelength conversion member, and a light conversion portion separated from the light transparent member that has a light conversion member on a light outgoing window portion of the light emitting apparatus or on a light path from the light outgoing window portion to the light sources (e.g., between the light transparent member and the light emitting devices, in the binding member), or between the light emitting devices and the covering member. In the case where a nitride phosphor is used that emits yellow to red light, a reddish component can be increased. In this case, it is possible to provide lighting with high general color rendering index Ra, or an LED with electric bulb color. Specifically, the amount of phosphor with a chromaticity point different from a light emitting device on the chromaticity diagram of CIE is adjusted based on the light-emission wavelength of the light emitting device. As a result, it is possible to emit light at any point on the chromaticity diagram on the line that is connected between the phosphor and the light emitting device. In addition to this, examples of the phosphors can be given by nitride phosphors, which convert near-ultraviolet to visible light into light in yellow to red ranges, oxynitride phosphors, silicate phosphors, $L_2SiO_4$:Eu (L is alkaline-earth metals), in particular $(Sr_xMae_{1-x})_2SiO_4$:Eu (Mae is alkaline-earth metals such as Ca and Ba), and the like. Examples of the nitride group phosphors and the oxynitride phosphors can be given by Sr—Ca—Si—N:Eu, Ca—Si—N:Eu, Sr—Si—N:Eu, Sr—Ca—Si—O—N:Eu, Ca—Si—O—N:Eu, Sr—Si—O—N:Eu, and the like. Examples of the alkaline-earth silicate phosphor can be represented by general formula $LSi_2O_2N_2$:Eu, general formula $L_xSi_yN_{(2/3x+4/3y)}$:Eu, or $L_xSi_yO_zN_{(2/3x+4/3y-2/3z)}$:Eu (L is Sr, Ca, or Sr and Ca).

In the light emitting apparatus, the number of the light emitting devices 10 under one light transparent member 15 is not specifically limited. However, it is preferable that the light emitting apparatus includes two or more light emitting devices 10, which can emit light passing through one light transparent member 15. The reason is that it is possible to increase the total amount of light flux that travels toward the light receiving surface 15b, and as a result it is possible to increase the luminance of emitted light from the light emission surface 15a. In the case where a plurality of light emitting devices 10 are installed, the light emitting devices 10 can be joined to each other. However, in this case, it is preferable that the light emitting devices 10 are spaced at a suitable interval away from each other. The interval distance between the light emitting devices 10 can be suitably designed in consideration of the light directivity and the heat dissipation property of the light emitting apparatus, and the mount accuracy of the light emitting devices. For example, the interval distance can be not more than 10% of the size of the light emitting device.

(Covering Member and Sealing Member)

As shown in FIG. 1, the sealing member 26 covers parts of the light transparent member 15. Specifically, the sealing member 26 covers at least the side surfaces 15c of the light transparent member 15.

Resin materials as a base material of the sealing member 26 are not limited as long as they are transparent. Silicone resin compositions, denatured silicone resin compositions and the like are preferably used. However, transparent insulating resin compositions may be used such as epoxy resin compositions, denatured epoxy resin compositions and acrylic resin compositions. Also, excellent weather-resistant sealing members may be used such as hybrid resins containing at lease one of these resins. Also, excellent light-resistant inorganic material may be used such as glass and silica gel. Also, the sealing member can be formed in a desired shape on the light emission side to provide a lens effect. In this case, it is possible to focus light from the light emitting chips. In the embodiment 1, silicone resin is used as the sealing member in terms of thermal resistance and weather resistance.

In the embodiment 1, the sealing member 26 includes the light reflective material 2 in the aforementioned resin. It is preferable that the sealing member 26 includes at least two types of resin materials with different refractive indices from each other. In this case, it is possible to improve reflective ability, and to suppress a light leakage component that passes through the resin and is leaked to a neighbor member. That is, it is possible to direct light toward a desired direction. To effectively achieve the aforementioned effects, at least one type of resin material with less light absorption is included in resin as the base material, i.e., in the silicone resin in the embodiment 1. In the case where the sealing member 26 includes the light reflective material, the reflectivity of the sealing member 26 is increased. In addition, in the case where the sealing member 26 suitably includes transparent particles, reflection by the transparent particles can provide a covering member with low light absorption and low loss. In other words, outgoing light from the LED chips is reflected by the member 26 that covers the periphery of the LED chips, and is guided toward the LED chips or the light transparent member 15. The sealing member 26 may include one type of resin, for example, silicone resin. For example, two-component silicone resin can be used in that a main component and a hardener are mixed.

The light reflective material 2 included in the sealing member or the covering member 26 is one selected from the group consisting of oxides of Ti, Zr, Nb, Al and Si, or at least one selected from the group consisting of AlN and MgF. Specifically, the light reflective material 2 is at least one selected from the group consisting of $TiO_2$, $ZrO_2$, $Nb_2O_5$, $Al_2O_3$, MgF, AlN and $SiO_2$. It is preferable that the light reflective material included in the aforementioned member 26, in particular in the transparent resin, is one selected from the group consisting of oxides of Ti, Zr, Nb, and Al in particular as the transparent particles. In this case, the transparency and reflexivity of the light reflective material, and the refractive-index difference between the light reflective material and the base material are increased. The covering member may be composed of a formed member formed from the aforementioned light reflective materials. Specifically, the covering member may be a porous material such as an aggregated member or sintered member of the aforementioned particles that aggregate together. Also, the covering member may be a formed member formed by a sol gel process. The covering member of such a porous material is preferable. The reason is that, since the refractive-index difference between the aforementioned light reflective material and air within porous can be great, the light reflexivity of the covering member can be improved. In comparison between the covering member of porous material and the covering member that includes a base material such as the aforementioned resins, they are likely to be different in formability into a desired shape, sealing ability and airtight ability. If a light emitting apparatus is provided that includes the covering member containing either or both materials, it is preferable that the covering member contains the aforementioned base material. Also, in consideration of the characteristics of both types of covering members, the covering member can be composed of a complex formed member formed of the both types of covering members. For example, the covering member formed in a desired shape is impregnated with resin from the outside surface side so that the resin penetrates the outside surface of the covering member at a depth. In this case, the thus-formed covering member can seal the light emitting devices, improves airtightness, and achieves high reflective performance on the inside surface side as the light emitting device side that is provided by the porous property. The covering member or sealing member, or a surrounding member composed of the covering member does not necessarily completely or airtightly seal the light emitting devices. The inside parts of the covering member or the surrounding member may communicate with the outside. The covering member or the surrounding member may have air transparency. The covering member or the surrounding member is only required at least to prevent leakage of light, in particular, to prevent leakage of light in the light emission direction.

In the covering member including the light reflective material in aforementioned base material, the leakage distance of light varies in accordance with the content concentration or density of the light reflective material. For this reason, it is preferable that the content concentration or density is suitably adjusted in accordance with the shape and the size of the light emitting apparatus. For example, in the case where the light emitting apparatus is relatively small, the thickness of the covering member is required to be small which covers the light emitting device and the light transparent member. In other words, it is preferable that the light emitting apparatus includes a light transparent material at high concentration to allow the thin member to suppress light leakage. On the other hand, in production processes such as preparation of basis material of the covering member containing the light reflective material, and application and formation of the basis material, if high concentration of the light reflective material in the basis material makes the production difficult, the concentration of the light reflective material in the basis material may be suitably adjusted. Although the covering member has been described that includes the base material, same goes for the aforementioned porous member. As an example, according to the later-discussed comparative experiment, it is suitable that the content concentration is not less than 30 wt %, and the thickness is not less than 20 µm. These ranges can provide high luminance light with high directivity emitted from the light emission surface. Also, in the case where the concentration of the light reflective material is high, the heat dissipation property can be increased. As another example, the content concentration of the light reflective material in the silicone resin can be not less than more than 20 wt % and not more than 30 wt %. This range is preferable since resin can have an appropriate viscosity, and underfill by the sealing member or covering member 26 can be easily formed.

(Covering Area)

As discussed above, the outgoing light from the light emitting devices 10 passes the light receiving surface 15b of the light transparent member 15, travels in the light transparent member 15, and then outgoes from the light emission surface 15a. Thus, the following operation and working effects can be provided by covering at least the side surfaces 15c of the light transparent member 15 with the sealing member 26. Firstly, it is possible to prevent that light leaks from the side surface 15c areas. Secondly, it is possible to suppress outward emission from the side surface 15c side of light with considerable color difference relative to light emission from the light emission surface 15a, and therefore to reduce color unevenness in the entire light emission color. Thirdly, since outward light emission area is restricted by reflecting light that travels toward the side surfaces 15c toward the light outgoing side, it is possible to increase the directivity of emitted light and to increase the luminance of the light emission surface 15a. Fourthly, since heat generated from the light transparent member 15 is conducted to the sealing member 26, it is possible to increase the heat dissipation property of the light transparent member 15. In the case where the light transparent member 15 contains the wavelength conversion member, since the wavelength conversion member generates heat much, this configuration is very effective.

As long as the sealing member 26 covers the side surfaces 15c contiguous to the light emission surface 15a of the light transparent member 15, i.e., the side surface 15c side that extends in parallel to the thickness direction, and the light emission surface 15a is exposed from the sealing member 26, the external shape of the sealing member 26 is not specifically limited. For example, the sealing member 26 may be configured protruding outward relative to the light emission surface 15a (this embodiment) or recessed (embodiment 3). On the other hand, in the embodiment 1, as shown in FIG. 1, the external surface of the sealing member 26 is configured extending along the surface of the light emission surface 15a, in other words, the exposed surface of the covering area of the sealing member 26 is substantially coplanar with the surface of the light emission surface 15a. Accordingly, it is possible to provide easy production and to improve yields. In addition, since the side surfaces 15c are substantially entirely covered, it is possible to increase the heat dissipation property of the light transparent member 15.

In the embodiment 1, the sealing member 26 covers a part of the light receiving surface 15b as well as the side surfaces 15c of the light transparent member 15. Specifically, as shown in FIG. 1, space between the light transparent member 15 and the wiring substrate 9 is filled with the sealing member 26 so that the peripheries of the light emitting devices 10 are covered by the sealing member 26. Specifically, the sealing member 26 covers an area of the light receiving surface 15b of the light transparent member 15 except areas that face the light emitting devices 10. In this configuration, the optically-coupling areas between the light emitting devices 10 and the light transparent member 15, and the covering area of the sealing member 26 are provided in the light receiving surface of the light transparent member. As a result, light can be guided limitedly through the optically-coupling areas so that primary light from the light emitting devices 10 can be highly efficiently guided from the optically-coupling areas toward the light transparent member 15 side. Also, the sealing member 26 in the covering areas reflects, toward the light outgoing side, light that travels toward the light receiving surface side of the light transparent member. Accordingly, it is possible to suppress loss of primary light that enters the light transparent member. Such loss may occur due to light absorption by the wiring substrate 9 and the like. As shown in FIG. 1 or the like, in the case where a plurality of light emitting devices 10 are joined to one light transparent member 15, it is preferable that space between the light emitting devices is also filled with the sealing member 26 so that the sealing member 26 covers separation areas located between the junction areas of the light receiving surface 15b to which the light emitting devices are joined. The light transparent member 15 is likely to hold heat generated right above the junction areas to which the light emitting devices 10 are joined. This configuration can improve heat dissipation of the aforementioned separation areas. In addition, it is preferable that the light transparent member 15 has the protrusion areas that protrude outward relative to the light emitting devices 10, and the protrusion areas on the light receiving surface 15b side are covered by the sealing member 26 as discussed above. The reason is that this configuration facilitates heat dissipation toward the outer peripheries of the light transparent member 15 and the light emitting device 10. Since the covering areas of the light transparent member 15 are increased which are covered by the sealing member 26, it is possible further improve the heat dissipation from the light transparent member 15.

(Additive Member)

In addition to the light reflective material 2 and the light conversion member, appropriate members such as viscosity-increasing agent can be added to the covering or sealing member 26, and the light transparent member 15 in accordance with applications. Thus, the light emitting apparatus can be provided that has desired light emission color, directional characteristics, and the color of these members or the apparatus surface, for example the external surface of the covering member can be colored in black in order to increase the contrast with environmental light. Similarly, various types of coloring agents can be added as a filter material that provides a filter effect cutting off external entering light and light with unnecessary wavelength from the light emitting devices.

(Adhesive Material)

An adhesive material 17 is interposed on the boundary between the light emitting device 10 and the light transparent member 15 so that the light emitting device 10 and the light transparent member 15 are fastened. The adhesive material 17 is preferably composed of a material that can effectively guide light emitted from the light emitting device 10 toward the light transparent member 15 side, and can optically couple the light emitting device 10 and the light transparent member 15 to each other. An example of material of the adhesive material can be provided by the resin material used for aforementioned members. As an example, a transparent adhesive material is used such as silicone resin. Also, the light emitting device 10 and the light transparent member 15 can be fastened to each other by crystal adhesion by thermocompression bonding or the like.

(Light Emitting Apparatus)

Figure 3A:
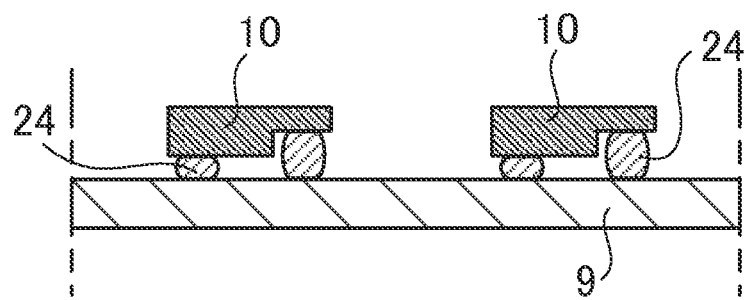
FIGS. 3A, 3B, and 3C Schematic views showing a production method of the light emitting apparatus according to the embodiment 1.

The aforementioned light emitting devices 10 are installed on the wiring substrate 9 in a flip chip mounting manner. The aforementioned light transparent member and the covering member are arranged on the light emitting devices 10 and the wiring substrate 9. Thus, the exemplary light emitting apparatus 1 shown in FIG. 1 is provided. As an example of production method of the light emitting apparatus, a production method is described with reference to FIGS. 3A-3C. First, as shown in FIG. 3A, the bumps 24 are formed on the wiring substrate 9 or the light emitting devices 10 in accordance with the flip chip mounting pattern. Subsequently, the light emitting devices 10 are mounted by the bumps 24 in a flip chip mounting manner. In this example, one LED chip is arranged for an area corresponding to one light emitting apparatus. However, the number of installed chips can be suitably changed in accordance with the size of the light emission surface and the size of the light transparent member. Also, the light emitting devices 10 may be mounted by eutectic adhesion. In this case the junction area between the wiring substrate 9 and the light emitting device 10 can be large to facilitate heat dissipation. Therefore, it is possible to improve heat dissipation.

Figure 3B:
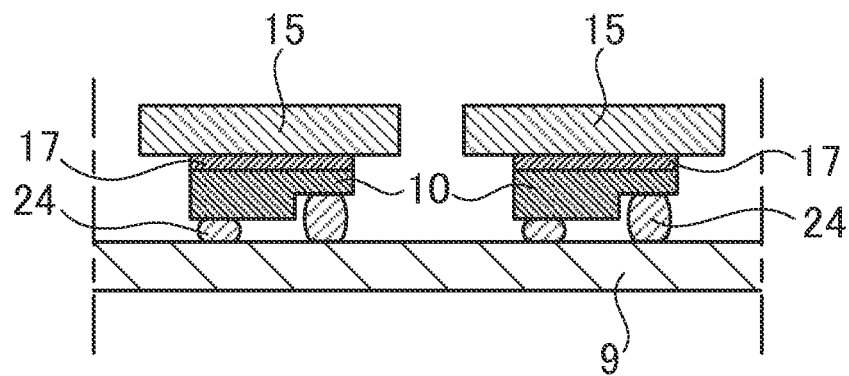

Also, in a process shown in FIG. 3B, silicone resin as the adhesive material 17 is applied onto the back surface side of the light emitting device 10 (onto the sapphire substrate back surface, or onto the nitride semiconductor exposure surface in the case where the substrate is removed by LLO), and the light transparent member 15 is laminated on the light emitting device 10. Subsequently, the silicone resin 17 is thermally cured so that the light emitting devices 10 and the light transparent member 15 are adhered on each other.

Figure 3C:
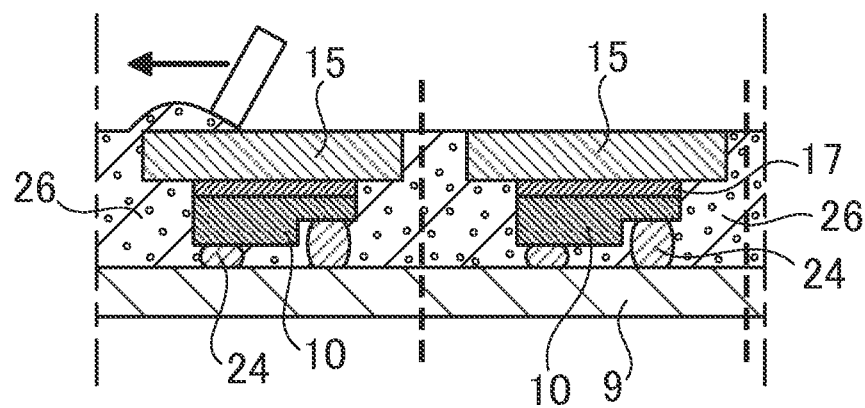

In addition, screen printing is conducted in a process shown in FIG. 3C. In screen printing, a metal mask is arranged on the wiring substrate 9. Resin is applied that forms the sealing member 26, and is spread by a squeegee. The surface of the light transparent member 15 is wiped by the squeegee so that the surface of the sealing member 26 extends along the surface of the light transparent member 15, in other words, so that both the surfaces are substantially coplanar with each other. Alternatively, the surface of the sealing member 26 may be flattened by its own weight without using the squeegee after resin 26 potting. Alternatively, the sealing member 26 may be formed by transfer molding. After the resin 26 is cured, the metal mask is removed, and the resin and the wiring substrate are cut at predetermined positions (for example, dashed lines in FIG. 3C) into a sub-mount substrate size in dicing.

However, the method for arranging the resin 26 is not specifically limited which covers the peripheries of the light emitting devices 10. For example, a package may be formed as a frame member that forms boundaries of an area where the resin 26 is arranged, and may be filled with the resin 26. The frame member can be removed after the light emitting apparatus is formed. Alternatively, the frame member may remain if the softness of resin for filling the inside of the frame member requires the frame member remaining. The frame member serves the outline of the light emitting apparatus, and can increase the strength of the light emitting apparatus. Also, the wiring substrate may have a cavity to simplify the process. Also, the light emitting device may be directly mounted onto a predetermined installation location of the light emitting apparatus. In other words, the sub-mount may be eliminated. Also, each of the aforementioned sub-mount substrates separated from each other can be the light emitting apparatus. Alternatively, a lens or the like may be adhered to and seal each of the aforementioned sub-mount substrates. In this case, each sub-mount with the lens can be the light emitting apparatus.

Embodiment 2

Figure 4:
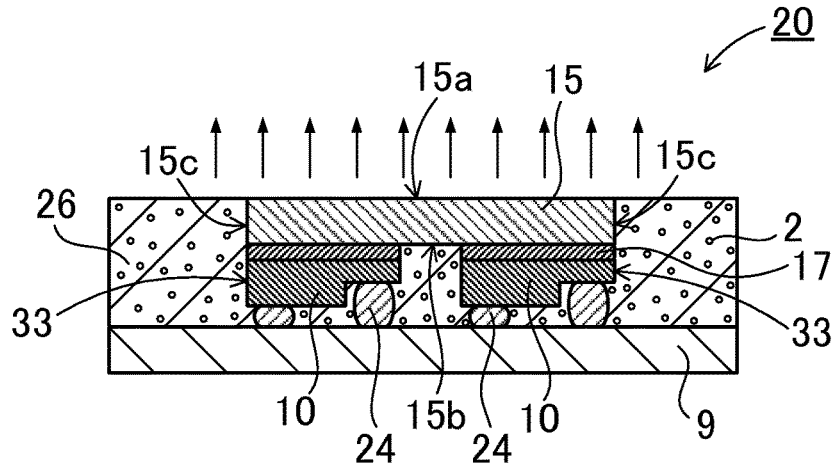
FIG. 4 Schematic view showing a production method of the light emitting apparatus according to an embodiment 2.

In an embodiment 2, the light emitting devices 10 are arranged relative to the light transparent member 15 in another exemplary arrangement. FIG. 4 is a schematic cross sectional view showing a light emitting apparatus 20 according to the embodiment 2. In the light emitting apparatus 20 shown in FIG. 4, the side surfaces 15c of the light transparent member 15 are substantially coplanar with the end surfaces 33 of the light emitting devices 10, in other words, the side surfaces of the light transparent member 15 and the light emitting device 10 are substantially coplanar with each other. This arrangement can prevent that color unevenness is likely to occur in a part where the light transparent member protrudes relative to the device in the foregoing embodiment 1, i.e., outer peripheral parts of the light transparent member, due to an insufficient amount of light from the light emitting device. Here, "substantially coplanar" in this specification refers to approximately coplanar in terms of the aforementioned functions. For example, "substantially coplanar" can be ±10% of the size of the light transparent member or the light emitting device of the coplanar light emitting apparatus. This is not limited to "substantially coplanar" of the light transparent member with the light emitting device, but can be applied to "substantially coplanar" of the light emission surface of the light transparent member with the external surface of the covering member that surrounds the light emission surface.

Embodiment 3

Figure 5:
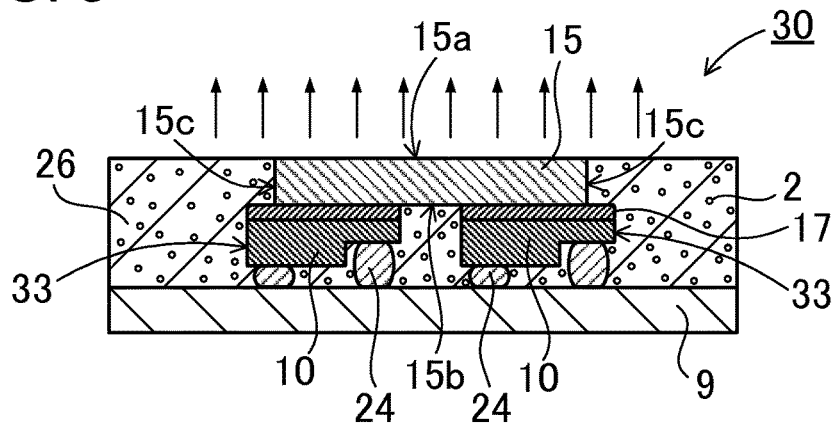
FIG. 5 Schematic view showing a production method of the light emitting apparatus according to an embodiment 3.

FIG. 5 shows a schematic cross-sectional view showing a light emitting apparatus 30 according to an embodiment 3. In the light emitting apparatus 30 shown in FIG. 5, the light transparent member 15 is laminated on parts of the light emitting devices 10, in other words, the side surface 15c of the light transparent member 15 is located inside the end surface 33 of the light emitting device 10.

In arrangements shown in FIG. 1 (embodiment 2), FIG. 4 (embodiment 3), and FIG. 5 (this embodiment), the periphery of the light emission surface 15a is covered by the sealing member 26 in a plan view from the light outgoing side. Accordingly, light is not emitted from the outside areas of the sealing member 26 containing the light reflective material 2. In other words, the light emission area of the light emitting apparatus substantially depends on the light emission surface 15a of the light transparent member 15. For this reason, in the arrangement according to the embodiment 1 shown in FIG. 1, since the light emission surface 15a can be large as compared with the light emitting device, the amount of light flux and the output from the light emitting apparatus can be increased. In the example according to this embodiment shown in FIG. 5, the light emission area is reduced, and the light emission surface is small as compared with the light emitting device. Accordingly, it is possible to further even the mixed color ratio to substantially constant. Therefore, it is possible to emit light with further reduced color unevenness. In addition, since the light emission area is reduced, it is possible to increase relative luminance. Also, the arrangement shown in FIG. 4 is a kind of middle arrangement between the examples shown in FIGS. 1 and 5. Therefore, it is possible to emit light with light flux/luminance and color distribution in balance.

Embodiment 4

Figure 6:
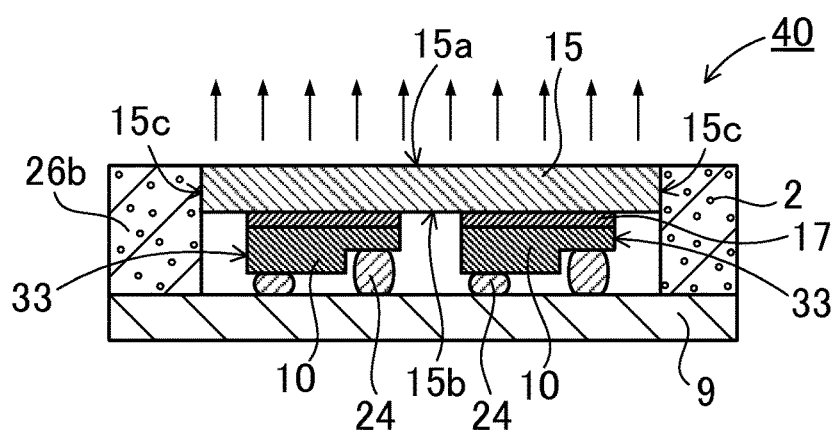
FIG. 6 Cross-sectional view schematically showing a light emitting apparatus according to an embodiment 4.

Also, it is important that the sealing member 26 is arranged at least on the periphery of the light emission surface 15a of the light transparent member 15, in other words, the sealing member 26 is formed in surface contact with the side surfaces 15c to restrict the light emission area of the light emitting apparatus to the light emission surface 15a. Other covering areas by the sealing members 26 are not specifically limited. A light emitting apparatus 40 according to an embodiment 4 is different from the embodiments 1 to 3 from the viewpoint of the covering area of the sealing member 26 for covering the light emitting device 10. FIG. 6 is a schematic cross sectional view showing a light emitting device 40 according to the embodiment 4. In the light emitting apparatus 40, other structures except a covering area of a sealing member 26b is substantially similar to the embodiment 1 to 3, and therefore similar components are attached with the same reference numerals and their description is omitted.

The covering area of the sealing member 26b according to the embodiment 4 for covering the light emitting device 10 is different from the embodiments 1 to 3. That is, the sealing member 26b covers only outer parts away from the end surfaces 33 of the light emitting devices 10. Accordingly, exposed parts are spaced away from each other that are not covered and are exposed from optically connecting parts and electrically and physically connecting parts. The optically connecting parts of the light emitting device surfaces are connected to the aforementioned light transparent member. The electrically and physically connecting parts of the light emitting devices are electrically and physically connected to the wiring substrate. The spaced areas between the two or more light emitting devices 10 are not filled with the sealing member 26b so that hollow parts are formed. In particular, in the example shown in FIG. 6, the sealing member 26b outside the light emitting devices 10 is spaced away from the end surfaces 33 of the light emitting devices 10. Specifically, the sealing member 26b is arranged on the end surface 33 sides of the light emitting devices 10 in substantially parallel to the end surfaces 33, and is spaced away from the end surfaces 33. That is, the light emitting device 10 is surrounded by the light transparent member 15 and the wiring substrate 9 in the vertical direction, and by the sealing member 26b in the horizontal direction. Thus, interior space is formed surrounded by these surrounding members, and cavities are formed on the peripheries of the light emitting devices 10. It is preferable that the covering member is formed as a surrounding member that surrounds the light receiving surface side area of the light transparent member and the light emitting devices, and covers parts of the wiring substrate or is arranged on the wiring substrate as discussed above. Also, it is preferable that the covering member is spaced away from the light emitting devices so that the interior area is formed inside the surrounding members as discussed in this embodiment. In this case, as illustrated, it is preferable that the surrounding member is formed as an outer case member that includes the light transparent member as a window portion of the surrounding member and a light emission surface of the outer case member, and is formed as an outer case member the light emission surface of which is arranged on the front surface side in the light outgoing direction.

In the case of the aforementioned configuration, that is, in the case where the interior area is formed by the aforementioned surrounding member, it is possible to suppress light loss caused by covering the aforementioned exposed part of the light emitting device (e.g., light absorption by the sealing member). That is, it is possible to increase the light amount of the aforementioned optically-coupling part. Therefore, the light emitting apparatus can have high output and luminance. In this case, it is preferable that, in order to increase the refractive-index difference between the aforementioned interior space and the light emitting device, the aforementioned interior space is airtightly sealed to provide high refractive-index difference between the device and air or gas at the exposed part. Also, in the case where a plurality of light emitting devices are optically coupled to one light transparent member, it is preferable that hollow parts are similarly formed between the devices. Also, in the case where the light emission surface of the light transparent member is sufficiently large as compared with the aforementioned light emitting device or its optically-coupling part, the aforementioned base materials of the light transparent member and the covering member such as resin can be suitably employed. In this case, the light receiving surface of the light transparent member has the optically-coupling area coupled to the device, and a filling member coupling area coupled to the transparent member with which the interior space is filled. Accordingly, light from the device enters the aforementioned filling member in addition to a path where the light from the device directly enters the optically-coupling area. As a result, light can enter the light transparent member through the filling member coupling area. Therefore, the light emission surface can be larger than the device. In addition, the shape of the sealing member 26b is simple. Accordingly, it is also possible to provide the light emitting apparatus 40 in that the sealing member 26b is produced separately from the light transparent member 15, and coupled to the light transparent member 15.

Example 1

In order to evaluate the advantages of light emission properties of the light emitting apparatuses according to the embodiments, the following examples are produced. As shown in FIG. 1, the light emitting apparatus 1 according to an example 1 includes one light transparent member 15, and the two LED chips with an approximately square of about 1 mm×1 mm. The sealing member 26 covers parts of the light transparent member 15 and the light emitting device 10. The light transparent member 15 has a plate shape. The light emission surface 15a, and the light receiving surface 15b opposed to the light emission surface 15a have a rectangular shape of about 1.1 mm×2.2 mm. Also, the thickness is 150 μm. Also, the sealing member 26 is formed of silicone resin containing $TiO_2$ particles. As shown in FIG. 1, the sealing member 26 is formed covering peripheral parts of the light emission surface 15a, specifically, the side surfaces 15c of the light transparent member 15 in plan view from the light outgoing side of the light emitting apparatus 1, and extending planarly along the light emission surface 15a. That is, in the light emitting apparatus 1, the light emission surface 15a serves as the main light emission surface, and the periphery of the light emission surface 15a is covered by the sealing member 26 to suppress outward light emission from the covering areas. The light transparent member 15 covers the optically-coupling areas in the light receiving surface 15b coupled to the light emitting devices 10, and fills space between the wiring substrate 9 and the light transparent member 15 to cover the side surfaces and the mount side of the light emitting device 10.

Comparative Example 1

Figure 7:
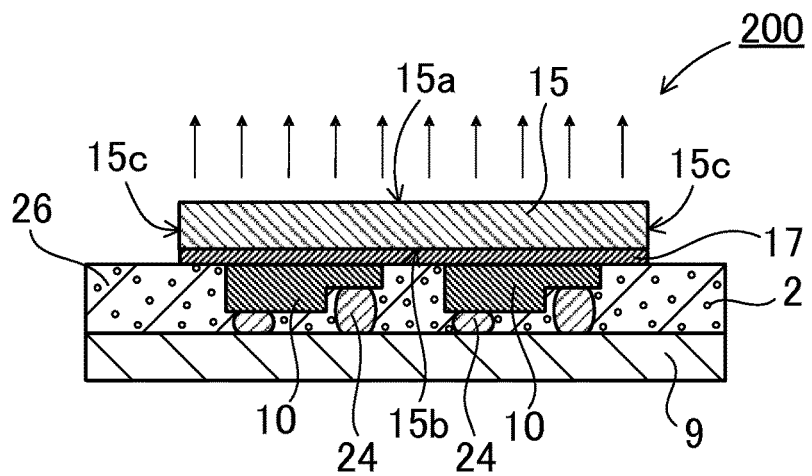
FIG. 7 Cross-sectional view schematically showing a light emitting apparatus according to a comparative example 1.

FIG. 7 is a schematic cross-sectional view showing a light emitting apparatus 200 according to a comparative example 1. The light emitting apparatus 200 has a covering area of a sealing member 26 for covering the light transparent member 15, which is only substantial difference from the light emitting apparatus 1 according to the example 1. That is, the light transparent member 15 protrudes upward relative to the surface of the sealing member 26. The sealing member 26 does not cover the side surfaces 15c of the light transparent member 15. Thus, the side surfaces 15c are externally exposed.

Figure 10:
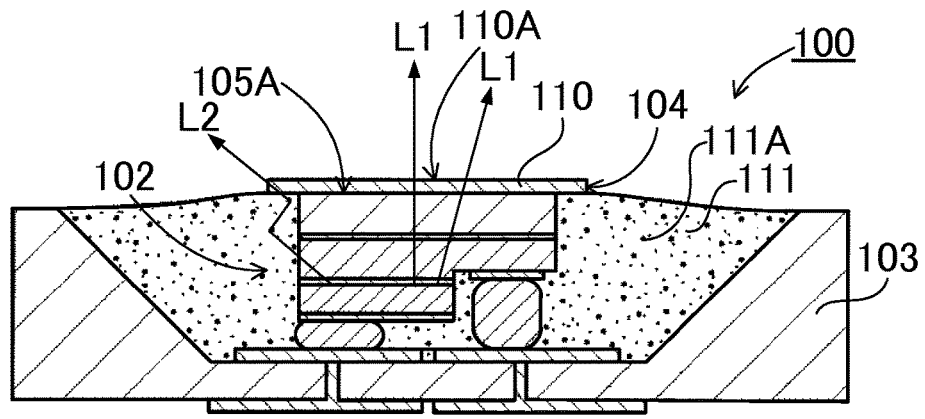
FIG. 10 Cross-sectional view showing a conventional light emitting apparatus.

As discussed above, as for production methods of the light emitting apparatus according to the example 1 and the comparative example 1, after the light transparent member 15 is laminated the light transparent member 15 is covered by the sealing member 26 in the example 1, while after the sealing member 26 is previously formed the light transparent member 15 is attached to the sealing member 26 in the comparative example 1. Thus, the sealing member 26 according to the comparative example 1 does not cover the side surfaces 15c of the light transparent member 15, in other words, the side surfaces 15c are externally exposed. As a result, in the light emitting apparatus 200 according to the comparative example 1, when outgoing light from the light emitting devices 10 pass through the light receiving surface 15b of the light transparent member 15, the outgoing light travels in the light transparent member 15, then outgoes from the exposed side surfaces 15c and the light emission surface 15a. That is, the light transparent member 15 of the light emitting apparatus 200 has a configuration similar to the light emitting apparatus 100 shown in FIG. 10, in other words, outgoing light from the light transparent member 15 is emitted not only from the light emission surface 15a but also from the side surfaces 15c side. For this reason, the difference between the light colors emitted from the light emission surface 15a and the side surface 15c is visually perceivable.

The following description describes the light flux, luminance and chromaticity distribution properties of the light emitting apparatuses according to the example 1 and the comparative example 1.

As for light flux, the maximum values of the example 1 and the comparative example 1 are 167 [Lm] (chromaticity ΦY about 0.339) and 166 [Lm] (chromaticity ΦY about 0.322), respectively. Accordingly, the example 1 and the comparative example 1 have a substantially equal light flux property. Therefore, it is found that almost no light cut-off effect occurs by covering the side surface 15b of the light transparent member 15 with the sealing member 26 in the example 1.

Figure 8:
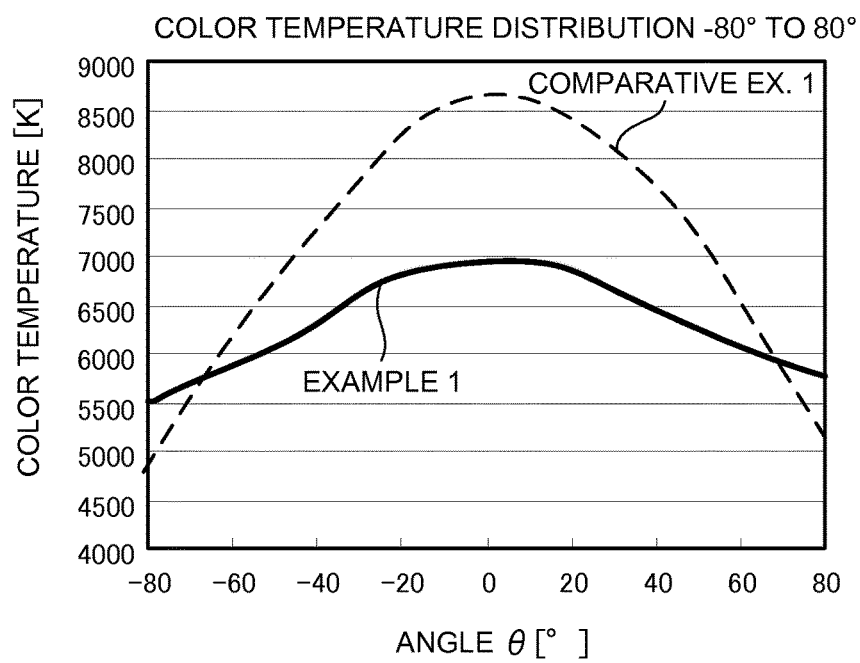
FIG. 8 Graph showing the chromaticity distribution of the light emitting apparatuses according to the example 1 and the comparative example 1.

As for luminance, the maximum luminance and the average value of average luminance of light emission are 6086 [cd/cm$^2$] and 3524 [cd/cm$^2$], respectively, in the example 1, while the maximum luminance and the average value of average luminance of light emission are 3952 [cd/cm$^2$] and 2500 [cd/cm$^2$], respectively. That is, the luminance of the example 1 improves about 40% compared with the comparative example 1. FIG. 8 shows the chromaticity distribution properties in the light emitting apparatuses of the example 1 and the comparative example 1. In both the example 1 and the comparative example 1, the relative maximum value of color temperature lies at a part where the viewing angle is small, i.e., on the optic axis. The color temperature decreases as the absolute value of the light outgoing angle is getting larger. However, in the comparative example 1, the color temperature difference between a greater angle and a lower angle is remarkably large. Specifically, the colors of a greater angle and a lower angle are different so that color unevenness is perceived. The color temperature difference in the example 1 is very small as compared with the comparative example 1. Although the color temperature in the comparative example 1 draws a steep curve the relative maximum value of which lies at the optic axis, the color temperature in the example 1 draws a gentle curve. In other words, the color temperature difference in the example 1 is small over the whole viewing angles, therefore, color unevenness is remarkably reduced. Since outgoing light in the transverse direction causes color unevenness in light emission of the entire light emitting apparatus irrespective of the light flux of the outgoing light to a greater or lesser extent, it is preferable that the sealing member 26 guides a component of the light traveling in the transverse direction toward the light emission surface 15a side as discussed above. We consider the advantages of the sealing member 26 in terms of luminance as follows.

In the light emitting apparatus that covers the side surfaces 15c of the light transparent member 15 according to the present invention (hereafter occasionally referred to as "covered type"), as the thickness of the light transparent member 15 increases, the covering area of the sealing member 26 for covering the side surfaces 15c accordingly increases. As discussed above, almost no effect occurs due to the light absorption by the sealing member 26 on the side surfaces. Accordingly, even in the case where the thickness of the light transparent member 15 increases, a component of light traveling in the thickness direction is guided toward the light emission surface 15a side. As a result, light will be emitted substantially only through the light emission surface 15a outward of the light emitting apparatus. That is, the luminance of the light emission surface 15a does not depend on the thickness of the light transparent member 15, and can be substantially constant on every occasion.

On the other hand, in the light emitting apparatus as discussed in the comparative example 1 that does not cover the side surfaces 15c of the light transparent member 15 (hereafter occasionally referred to as "non-covered type"), as the thickness of the light transparent member 15 increases, the ratio of a component of light outgoing from the side surfaces or the outgoing light outgoing from the side surfaces increases. In other words, the ratio of the light emitted from the light outgoing surface as the light outgoing side decreases. That is, the luminance of the light outgoing surface decreases.

Figure 9:
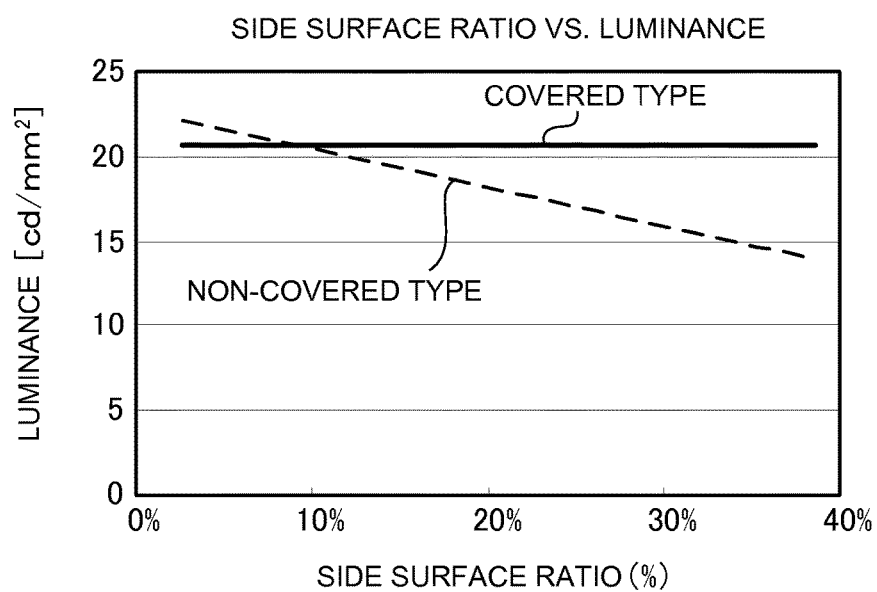
FIG. 9 Graph showing the relationship between the ratio of side surface relative to light emission surface of light transparent member, and angle.

Verification is conducted to verify the extent to which the ratio of the outgoing light from the light emission surface 15a and the both side surfaces 15c of the plate-shaped light transparent member, or a range of the thickness of the light transparent member 15 can effectively provide a luminance increase effect by covering the side surfaces 15c, in other words, can effectively provide a reflection effect on the side surfaces 15c by the sealing member 26. In FIG. 9, on the assumption that light is not emitted from the light receiving surface 15b as the bottom surface in both the covered type and the non-covered type, and that light is uniformly emitted from the light emission surface 15a and the side surfaces 15c in the non-covered type, the luminance of light emitted from the light emission surface 15a in each type is measured ([luminance]=[light flux]/[the area of light emission surface]). In addition, on the assumption that the total light flux of the covered type decreases 10% as compared with the non-covered type, luminance variation is shown in accordance with increase of the ratio of the thickness of the light transparent member 15 ([side surface ratio]=[the area of both side surfaces]/[the area of the light emission surface]). The 10% decrease of light flux stated herein is a value in consideration of light absorption by reflection in the sealing member 26 in the covered type. However, as discussed above, actually almost no light absorption occurs by the sealing member 26. The value is a generous estimate of light loss amount.

As shown FIG. 9, in the covered type, since the light emission area does not depend on the thickness of the light transparent member, the luminance is substantially constant. On the other hand, in the non-covered type, as the thickness of the light transparent member increases, the amount of light emitted from the light emission surface decreases. Thus, the relative luminance decreases. Also, thickness of the light transparent member 0.04 mm or the side surface ratio about 12% provides substantially the same luminance in the covered type and the non-covered type. In addition, thickness 0.02 mm or side surface ratio about 5.2% provides light flux difference 5%. Accordingly, in the case where the thickness of the light transparent member is greater than this value, it is found that the luminance of the covered type is higher than the non-covered type.

When this estimate is applied to the luminance properties of the aforementioned example 1 and the comparative example 1, it is found that a side surface ratio about 29% provides a luminance ratio at the aforementioned 5% light flux difference ([luminance of non-covered type]/[luminance of covered type]) about 134%. Also, as compared with luminance ratio at 0% light flux difference about 141%, the difference between the foregoing example 1 and the comparative example 1 is about 0,01%, and the luminance ratio of the foregoing example 1 and the comparative example 1 is about 141%. These values show good agreement with each other.

As discussed above, since the comparison verification between the covered type and the non-covered type based on the aforementioned assumption shows good agreement between the properties of the example 1 and the comparative example 1, it is found that this verification is effective.

(Thickness and Reflection Ability of Covering Member)

As for the light reflective material 2 included in the sealing member 26, in the light emitting apparatus 1 of the example 1, the silicone resin includes $TiO_2$ as the light reflective material 2 to form the sealing member 26. The reflective ability of the sealing member 26 and the light incoming depth into the sealing member 26 vary in accordance with the content of the light reflective material in transparent resin and the thickness of the covering member 26. For example, an Al film with high reflectivity and a W film with low reflectivity are formed on a ceramic substrate similar to the example 1. Silicone resin is mixed and kneaded with the $TiO_2$ particles (mean particle diameter 0.2 micrometer) similar to the example 1. Materials of the covering member are prepared with ratios of 25%, 33% and 50% by weight relative to the silicone resin. These materials are applied onto the aforementioned ceramic substrate. These materials are coated by spin coating at application revolution numbers of 2000, 4000 and 6000 rpm. The resin is thermally cured. Thus, test samples are produced. The reflectivities of the test samples made from the materials at the application conditions are measured in the direction perpendicular to the surface of the test samples. Thus, it is possible to evaluate the aforementioned reflective ability, the aforementioned light incoming depth, and the like.

For example, covering members with thicknesses of 20 μm and 70 μm are made from a 50 wt % material at revolution numbers of 6000 and 2000 rpm. On the other hand, the reflectivities of covering members do not depend on the difference between Al and W, and are substantially constant. As the revolution number increases, in other words, as the thickness of the member is getting smaller, it is observed that the reflectivity tends to slightly decrease. For example, the reflectivity decreases from 94% to 89% under the conditions of the aforementioned revolution number and member thickness.

Also, in the cases of about 25 wt % and 33 wt %, the difference of the reflectivities between the aforementioned Al and W reflective films [reflectivity of Al sample]–[reflectivity of W sample] is large. In particular, the difference tends to increase in a range of higher revolution number. The difference and the difference in a range of higher revolution number of the test sample of 33 wt % are smaller than the test sample of 25 wt %. For example, in the test sample of 33 wt % and revolution number 2000 rpm, almost no difference exists between Al and W reflective films. Also, the reflectivity of the aforementioned test sample of 33 wt % is lower than the aforementioned test sample of 50 wt %. In addition, the reflectivity of the test sample of 25 wt % is lower than the aforementioned test sample of 33 wt %. For this reason, the content of the reflective material can be not less than 30 wt %, preferably not less than 40 wt %, and more preferably not less than 50 wt %. It is found that the thickness can be not less than 20 μm. For this reason, it is also found that thickness of the covering member in this extent is sufficient around the outer peripheral parts of the light transparent member, in parts between the light transparent member and the wiring substrate, in protrusion parts of the light transparent member protruding relative to the device, in the device exposed parts, and in parts between devices.

In the light emitting apparatus 1 according to the example 1, the spacing distance between the opposed surfaces of the light transparent member 15 and the wiring substrate 9 is not less than 100 μm. Accordingly, in the case where this spacing area is filled with the sealing member 26, the sealing member 26 will have a thickness within the aforementioned range. Therefore, it is ensured that light is reflected toward the light receiving surface 15b side so that the light absorption effect by the wiring substrate 9 can be prevented.

Example 2

Similar to the light emitting apparatus 1 shown in FIG. 6, an apparatus is produced that includes hollow parts around the light emitting devices as follows.

Similar to the example 1, the light emitting devices are mounted on the wiring substrate, and the light transparent member is coupled to the light emitting devices. In this example, the light transparent member is larger than the wiring substrate, and has a size about 2.2 mm×3.2 mm. The light transparent member is arranged enclosed in the wiring substrate. In addition, the light emitting devices are also arranged enclosed in the wiring substrate. Subsequently, resin of the covering member according to the example 1 is applied to cover the side surfaces of the wiring substrate, and the side surfaces and parts of the light receiving surface of the light transparent member, and is formed by thermal curing. In this process, the side surfaces of the substrate allow the resin to serve as a weir so that the resin is held without entering the interior of the wiring substrate, that is, inner walls of the covering member are formed on the edges of the wiring substrate. The resin covering the substrate side surfaces on the substrate outside covers the light receiving surface of the light transparent member that protrudes outward of the wiring substrate. Thus, the hollow parts are formed between the interior walls of the resin and the light emitting devices. In this example, hollow parts are same as areas of the wiring substrate that protrude from the light emitting devices. The wiring substrate protruding parts and the hollow parts are formed around the outer peripheries of the light emitting devices at width 400 μm (distance from the light emitting device to the interior wall of the resin). Thus, the light emitting apparatus is produced which includes the hollow parts around the light emitting devices. A modified example without hollow part is produced for comparison with the light emitting apparatus including the hollow parts. In the modified example, in the aforementioned resin curing process, air bubbles are removed from resin so that the holding effect by the substrate side surfaces is reduced. Thus, the resin moves over the wiring substrate, and covers the light emitting device surfaces. The resin is thermally cured so that a covering member without hollow parts is formed. Thus, the light emitting apparatus according to the modified example is produced.

The light emission property $\Phi Y$ of both the light emitting apparatuses according to the two examples is about 0.37. The light flux of the example with hollow parts is 206.4 Lm. The light flux of the example without hollow parts is 203.2 Lm. Also, as for the ratio between light fluxes before and after resin application/formation, in other words, as for the ratio between the light flux of the light emitting apparatus with the light transparent member adhered on the light emitting device on the substrate but without the covering member and the light flux of the light emitting apparatus according to each foregoing example with the covering member obtained by forming resin on the light emitting apparatus without the covering member [light flux of apparatus with covering member]/[light flux of apparatus without covering member], the light flux ratio of the apparatus with hollow parts is 7.0%, and the light flux ratio of the apparatus without hollow parts is 4.8%. Other $\Phi Y$ values have similar tendency. That is, the apparatus with the hollow parts is higher in output improvement or power improvement.

A person skilled in the art predicts that restriction of light emission area by confining a part of the light emission area causes the following demerits, and therefore does not conduct such restriction. The reason is that, since the number of reflection occurrences will increase, light loss may occur, and as a result the emitted light flux may decrease. However, according to the present invention, contrary to this conventional idea, since the light emitting apparatus has the aforementioned configuration, in other words, even when the light emission area is restricted, it is possible to provide high luminance light emission in that light flux reduction is suppressed and additionally color unevenness is reduced. This effect is provided not only by the light confinement effect by the sealing member but also by a synergistic effect by the plate-shaped light transparent member itself that can suppress uneven wavelength conversion amount distribution and can effectively prevent color unevenness occurrence. In addition, in the case where a plurality of light emitting devices are arranged under one light transparent member having the wavelength conversion function, the luminance is high in proximity to a part right above each light emitting device, and the luminance decreases in accordance with a distance away from the light emitting device. For this reason, luminance unevenness and color unevenness tend to occur in the light emission surface. However, according to the configuration of the present invention, such luminance unevenness and color unevenness can be reduced. Therefore, it is possible to provide substantially uniform high luminance light emission in the light emission surface. In addition, according to the production method in that the sealing member 26 is formed after the light transparent member 15 is attached, it is possible to maintain intimate contact between the side surface side of the light transparent member 15 and the sealing member 26 irrespective of the amount of the light transparent member 15. Accordingly, it is possible to improve sealing environment for the light emitting devices enclosed by the light transparent member 15 and the sealing member 26. Therefore, it is possible to provide a long-life light emitting apparatus. This effect can be provided similarly by the case where space around the light emitting device is filled with the sealing member, and the sealing member covers the light emitting device surface as discussed in the example 1.

Example 3

Also, comparative evaluation is conducted for the difference of thermal resistance properties of members that composes the light transparent member. The light emitting apparatus according to an example 3 is similar to the light emitting apparatus according to the example 1. That is, the light transparent member 15 is formed of an inorganic material, specifically, a sintered member of YAG. On the other hand, in a light emitting apparatus according to a comparative example 2, the light transparent member 15 contains an organic material, and is formed in a resin sheet of silicone resin mixed with YAG. The thickness of the resin sheet is about 100 to 150 μm. In the light emitting apparatuses according to the example 3 and the comparative example 2, except that only the materials of the light transparent members are different from each other from the aforementioned viewpoint, other members are the same as those of the light emitting apparatus according to the example 1.

Figure 11:
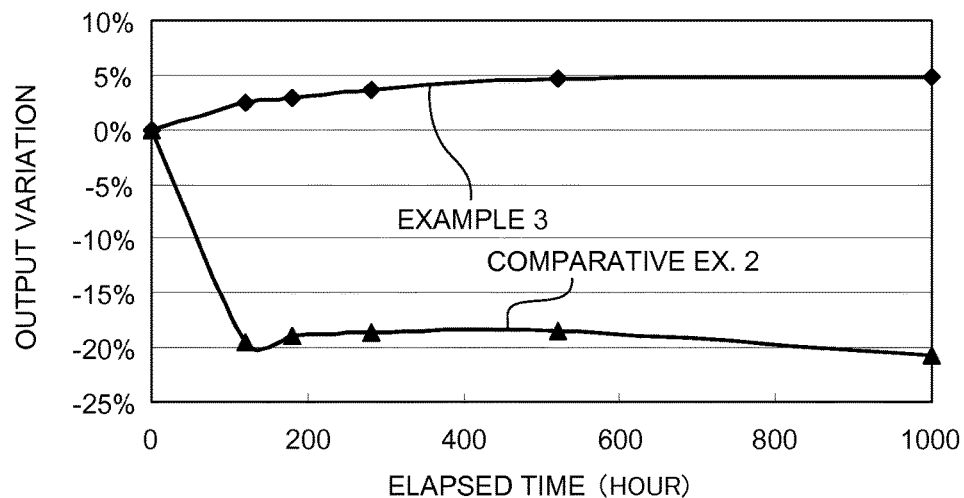
FIG. 11 Graph showing the outputs of an example 3 and a comparative example 2 in a thermal resistance test.
Figure 12:
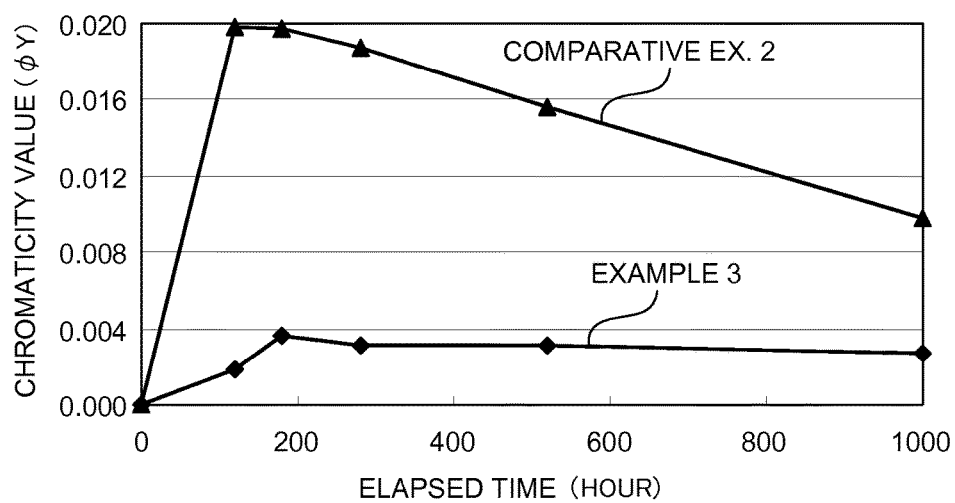
FIG. 12 Graph showing the chromaticity values of the example 3 and the comparative example 2 in a thermal resistance test.

As for the light emitting apparatuses according to the example 3 and the comparative example 2 that include the aforementioned light transparent members formed of YAG sintered material and resin sheet, respectively, to evaluate their thermal resistance properties, electric current of 700 mA is applied to the light emitting apparatuses, and continuously emit light for 1000 hours at environment of 85° C. FIG. 11 is a graph showing the variation of the output as time elapses. Also, FIG. 12 is a graph showing the variation of the chromaticity value ($\Phi Y$) as time elapses. As shown in FIG. 11, in the light emitting apparatus according to the example 3 that includes the YAG sintered material, the output tends to increase as time elapses. After that, the output that has increased is kept. When 1000 hours have elapsed, the output increases 5% as compared with the start of measurement. On the other hand, in the light emitting apparatus according to the comparative example 2 that includes the resin sheet, the output greatly decreases at just beginning of measurement. After that, the output does not make a recovery. When 1000 hours have elapsed, the output decreases 20% or more as compared with the start of measurement.

Also, in the light emitting apparatus according to the example 3 that includes the YAG sintered material, as shown in FIG. 12, the chromaticity value ($\Phi Y$) slightly increases at just beginning of measurement. However, the increase amount is small. In addition, even as time elapses, the variation of chromaticity value is small and stable. When 1000 hours have elapsed, the variation of chromaticity value remains an increase of 0.003 as compared with the initial value. On the other hand, in the light emitting apparatus according to the comparative example 2 that includes the resin sheet, the chromaticity value ($\Phi Y$) greatly increases at jut beginning of measurement. After that, the chromaticity value decreases as time elapses. Although the variation of chromaticity value is an increase of 0.01, the variation rate is large in a middle term, and the chromaticity is unstable.

Figure 14:
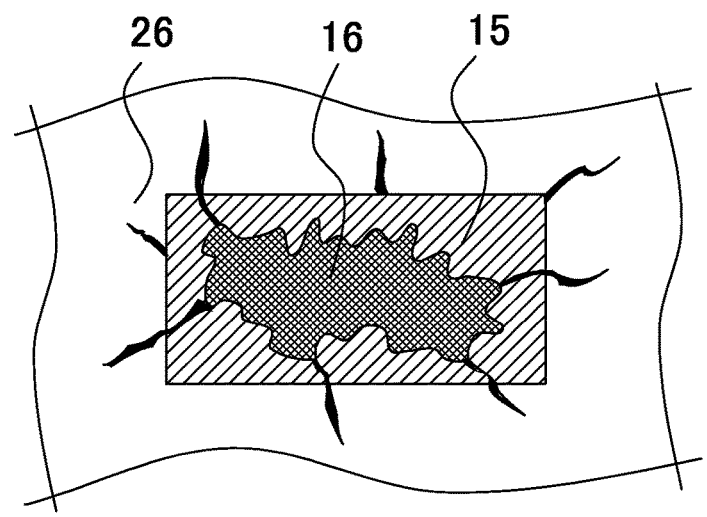
FIG. 14 Schematic plan view showing the periphery of the light transparent member of the light emitting apparatus according to the comparative example 2 after the thermal resistance test.

FIG. 13 shows the state of the light emitting apparatuses according to the example 3 and the comparative example 2 before the thermal resistance test. FIG. 14 shows the state of the light emitting apparatus of the comparative example 2 after 1000 hours has elapsed in the thermal resistance test under the aforementioned conditions. Both Figures are schematic plan view showing the periphery of the light transparent member 15. As shown in FIG. 14, the resin sheet as the light transparent member 15 according to the comparative example 2 is heavily damaged. The heavy damage can be easily seen in that a part of the sheet is deformed into a lump (deformed part 16 in the light transparent member). Also, the YAG phosphor mixed in the resin is greatly unevenly distributed. In addition, the cracks appear extending from the covering member 26 to the light transparent member 15. On the other hand, in the light emitting apparatus according to the example 3, even after the thermal resistance test, the shape of the light transparent member 15 formed of the sintered material shown in FIG. 13 does not change. Also, the YAG phosphor is unevenly distributed without uneven distribution. Thus, it can be conceived that, even in the case where the resin sheet and the sintered material have the same covered form by the covering member 26, the heat dissipation properties and heat stresses of the light transparent members are different from each other. It can be evaluated that the YAG sintered material is superior to the resin sheet based on the above result.

INDUSTRIAL APPLICABILITY

A light emitting apparatus and a method for producing the light emitting apparatus according to the present invention can be suitably applied to a light source for lighting, an LED display, a back light source, a signal light, an illuminated switch, various sensors, various indicators, and the like.

EXPLANATION OF REFERENCE LETTERS OR NUMERALS 1, 20, 30, 40 . . . Light Emitting Apparatus
2 . . . Light Reflective Material
3A . . . First Electrode (N Type Pad Electrode)
3B . . . Second Electrode (P Type Pad Electrode)
5 . . . Growth Substrate (Sapphire Substrate)
6 . . . First Nitride Semiconductor Layer (N-Type Semiconductor Layer)
7 . . . Second Nitride Semiconductor Layer (P-Type Semiconductor Layer)
8 . . . Light Emitting Layer (Active Layer)
9 . . . Wiring Substrate (Sub-Mount)
10 . . . Light Emitting Device
11 . . . Semiconductor Structure
13 . . . Transparent Conductive Layer (Transparent Electrode, ITO)
14 . . . Protection Film
15 . . . Light Transparent Member
15a . . . Light Emission Surface
15b . . . Light Receiving Surface
15c . . . Side Surface
16 . . . Deformed Part of Light Transparent Member
17 . . . Adhesion Material (Silicone Resin)
24 . . . Electrically Conductive Member
26, 26b . . . Covering Member (Sealing Member, Resin)
33 . . . End Surface
100, 200 . . . Light Emitting Apparatus
102 . . . LED Device
103 . . . Case
104 . . . Side Surface
105A . . . Light Outgoing Surface
110 . . . Phosphor Layer
110A . . . Light Emission Surface
111 . . . Coating Material
111A . . . Light Reflective Particle
L1, L2 . . . Light

The invention claimed is:

1. A light emitting apparatus comprising:
a mount substrate;
at least one light emitting device mounted on a planar surface of said mount substrate in a flip-chip manner;
a light transparent member that receives incident light emitted from the light emitting device; and
a covering member,
wherein said light transparent member is a light conversion member that has an externally exposed light emission surface and a side surface contiguous to the light emission surface,
wherein said covering member contains a light reflective material, and covers at least the side surface of said light transparent member,
wherein an outermost side surface of said covering member is coplanar with an outermost side surface of said mount substrate, and
wherein said planar surface of said mount substrate on which said light emitting device is mounted extends to said outermost side surface of said mount substrate.

2. The light emitting apparatus according to claim 1, wherein a content of said light reflective material in the covering member is not less than 50 wt %.

3. The light emitting apparatus according to claim 1, wherein said light reflective material is at least one material selected from the group consisting of $Al_2O_3$, AlN, MgF, $TiO_2$, $ZrO_2$, $Nb_2O_5$, $SiO_2$.

4. The light emitting apparatus according to claim 1, wherein said light reflective material is $TiO_2$.

5. The light emitting apparatus according to claim 1, wherein the at least one light emitting device comprises a plurality of light emitting devices that are optically connected to one light transparent member as the light transparent member.

6. The light emitting apparatus according to claim 1, wherein said covering member surrounds said light emitting device.

7. The light emitting apparatus according to claim 6, wherein said light transparent member has a light receiving surface opposed to said light emission surface, and wherein said light emitting device is joined to said light receiving surface.

8. The light emitting apparatus according to claim 7, wherein said covering member covers said light emitting device.

9. The light emitting apparatus according to claim 7, wherein said light emitting device is enclosed by said light transparent member in a plan view from said light emission surface side.

10. The light emitting apparatus according to claim 1, wherein the at least one light emitting device comprises a plurality of light emitting devices,
wherein the covering member surrounds the plurality of light emitting devices,
wherein said light transparent member further comprises a light receiving surface opposed to said light emission surface, and
wherein the plurality of light emitting devices are joined to the light receiving surface of said light transparent member, and light from each of the light emitting devices is incident upon the light receiving surface.

11. The light emitting apparatus according to claim 10, wherein each of said light emitting devices is mounted on a mount substrate in a flip-chip mounting manner.

12. The light emitting apparatus according to claim 10, wherein said covering member covers each of said light emitting devices.

13. The light emitting apparatus according to claim 10, wherein said covering member includes, on said light emission surface side of the light emitting apparatus, an externally exposed surface coplanar with said light emission surface.

14. The light emitting apparatus according to claim 10, wherein said light emitting devices are enclosed by said light transparent member in a plan view from said light emission surface side.

15. The light emitting apparatus according to claim 14, wherein junction areas and a covering area are arranged on the light receiving surface side of said light transparent member, wherein said light emitting devices are joined to the junction areas, and the covering area is covered by said covering member.

16. The light emitting apparatus according to claim 15, wherein said light emitting devices are separated away from each other, and a separation area is located on the light receiving surface side of said light transparent member between said junction areas, wherein said covering area is disposed in said separation area.

17. The light emitting apparatus according to claim 15, wherein said light transparent member includes a protrusion area that protrudes outward relative to said light emitting devices, wherein said covering area is arranged in the protrusion area of said light receiving surface.

18. The light emitting apparatus according to claim 7, wherein said semiconductor device structure does not include a growth substrate.

19. The light emitting apparatus according to claim 1, wherein a content of said light reflective material in the covering member is not less than 40 wt %.

20. The light emitting apparatus according to claim 1, wherein a content of said light reflective material in the covering member is not less than 30 wt %.

* * * * *